(12) United States Patent
Oomman et al.

(10) Patent No.: US 9,651,615 B2
(45) Date of Patent: *May 16, 2017

(54) DESIGN-FOR-TEST TECHNIQUES FOR A DIGITAL ELECTRONIC CIRCUIT

(71) Applicant: Genesys Testware, Inc., Fremont, CA (US)

(72) Inventors: Bejoy G. Oomman, Fremont, CA (US); Maddumage D. G. Karunaratne, Johnstown, PA (US)

(73) Assignee: Genesys Testware, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/211,739

(22) Filed: Jul. 15, 2016

(65) Prior Publication Data

US 2016/0320452 A1 Nov. 3, 2016

Related U.S. Application Data

(63) Continuation of application No. 14/570,561, filed on Dec. 15, 2014, now Pat. No. 9,423,455.

(51) Int. Cl.
| | |
|---|---|
| *G06F 11/22* | (2006.01) |
| *G06F 17/50* | (2006.01) |
| *G01R 31/317* | (2006.01) |
| *G01R 31/3177* | (2006.01) |
| *G01R 31/3185* | (2006.01) |

(52) U.S. Cl.
CPC ... *G01R 31/31704* (2013.01); *G01R 31/3177* (2013.01); *G01R 31/31723* (2013.01); *G01R 31/318563* (2013.01); *G01R 31/318583* (2013.01)

(58) Field of Classification Search
USPC .................................. 714/726, 731; 716/136
See application file for complete search history.

(56) References Cited

U.S. PATENT DOCUMENTS

| | | | |
|---|---|---|---|
| 5,065,090 A | 11/1991 | Gheewala | |
| 7,665,001 B2 | 2/2010 | Baik et al. | |
| 8,650,524 B1 * | 2/2014 | Chakravadhanula | G06F 17/505 |
| | | | 716/106 |
| 8,904,256 B1 * | 12/2014 | Chakravadhanula | G01R 31/318547 |
| | | | 714/729 |
| 2002/0048405 A1 * | 4/2002 | Zandi | G06F 17/148 |
| | | | 382/232 |
| 2006/0242502 A1 * | 10/2006 | Wang | G01R 31/31926 |
| | | | 714/724 |

(Continued)

OTHER PUBLICATIONS

Dong Hyun Baik et al. "2. Random Access Scan: A solution to test power, test data volume and test time" Proceedings of the 17th International Conference on VLSI design, 2004.

(Continued)

*Primary Examiner* — Brian Ngo
(74) *Attorney, Agent, or Firm* — Michael B. Einschlag

(57) ABSTRACT

A digital electronic circuit (DCCT) configured for testing in accordance with a Design-for-Test ("DFT") technique such as a hierarchical, compressed random access scan ("CRAS-N") DFT technique and, in particular, a segmented, random access scan a ("SRAS") DFT technique.

6 Claims, 23 Drawing Sheets

(56) References Cited

U.S. PATENT DOCUMENTS

| | | | | |
|---|---|---|---|---|
| 2006/0242515 A1* | 10/2006 | Alvamani | ...... | G01R 31/318547 714/729 |
| 2010/0115476 A1* | 5/2010 | Adams | ................ | G06F 17/5077 716/132 |
| 2010/0192030 A1* | 7/2010 | Kapur | ............ | G01R 31/318547 714/726 |
| 2014/0281774 A1* | 9/2014 | Wohl | ............. | G01R 31/318547 714/727 |

OTHER PUBLICATIONS

Anand S. Mudlapur et al. "4. A Random Access Scan Architecture to Reduce Hardware Overhead" Proceedings of the IEEE International Test Conference, 2005, Paper 15.1, pp. 1-9.

Yu Hu et al. "Localized Random Access Scan: Towards Low Area and Routing Overhead" Design Automation Conference 2008 ASPDAC 2008 Asia and South Pacific, pp. 565-570.

Donald E. Knuth "The Art of Computer Programming vol. 1: Fundamental Algorithms" Addison-Wesley Professional; 3rd edition (Nov. 14, 1997), pp. 28-29 and 315-341.

M. Abramovici et al. "Digital Systems Testing and Testable Design" Publisher: Wiley-IEEE Press, ISBN-10:0780310624, Sep. 1994, pp. 364-381.

Hisashige Ando, "Testing VLSI with Random Access Scan" Compcon 80, IEEE Computer Society International Conference, Feb. 1980, pp. 50-52.

K. Wagner, "Design for Testability in the Amdahl 580", Digest of Computer Society International Conference (COMPCON), 1983, pp. 384-388.

* cited by examiner

| No | Pin | Direction | Description | Function |
|---|---|---|---|---|
| 1 | D | In | Functional data | Functional data in |
| 2 | CLK | In | Functional Clock | Functional data capture clock |
| 3 | SI | In | Scan In | Test data in |
| 4 | TCK | In | Test Clock | Test data capture handling clock |
| 5 | Q | Out | Functional output | Functional data out |
| 6 | CS | In | Cell Select | Random access scan (RAS) |
| 7 | OE | In | Observe Enable | Optionally disable test output for power reduction |
| 8 | CO | In | Control Override | Optional override cell select for circuit initialization |
| 9 | OO | In | Observe Override | Optionally override cell select for signature accumulation |
| 10 | OS | In | Output Select | Optionally bypass SRAS cell for race paths |
| 11 | TQ | Out | Test Output | Test data out |

Figure 13

| No. | D | CLK | SI | TCK | CS | CO | OO | OS | OE | Q | TQ | Description |
|---|---|---|---|---|---|---|---|---|---|---|---|---|
| 1 | A | ^ | X | 0 | 1 | X | X | 0 | 1 | A | A | Functional capture |
| 2 | A | 0 | A | 0 | 1 | X | X | 0 | 1 | A' | A' | Hold the value |
| 3 | X | X | X | X | X | X | X | X | 0 | X | 0 | Test output disable |
| 4 | X | X | X | X | 0 | X | 0 | X | X | X | 0 | Test output disable |
| 5 | X | 0 | A | ^ | 1 | X | X | 0 | 1 | A | A | Test capture |
| 6 | A | ^ | A | ^ | X | 1 | 1 | 0 | 1 | A | A | All output select |
| 7 | A | ^ | A | ^ | 1 | X | 1 | 0 | 1 | A | A | All output select |
| 8 | X | 0 | A | ^ | 0 | 1 | 0 | 0 | 1 | A | 0 | Set/Reset all |
| 9 | A | ^ | A | ^ | 0 | 0 | 1 | 0 | 1 | A' | A' | Disable capture |
| 10 | X | 0 | A | 1 | 1 | X | X | 1 | 1 | X | A | Scan bypass |
| 11 | X | 0 | A | 1 | X | 1 | 1 | 1 | 1 | X | A | Scan bypass |
| 12 | A | 1 | X | 0 | X | 1 | 1 | 1 | 1 | 1 | A | Functional bypass |
| 13 | A | 1 | X | 0 | 1 | X | X | 1 | 1 | X | A | Functional bypass |
| 14 | A | X | A | X | 0 | 0 | 0 | 0 | X | A' | 0 | NOP, no operation |

Figure 14

| No. | Pin | Description |
|---|---|---|
| 1 | ENA | Selector Block Enable signal; input bit |
| 2 | SAD | Segment Address Register, an encoded bit vector |
| 3 | COM | Compress mode signal; input (together with INV input, provides address modes) |
| 4 | INV | Invert decode signal; input (together with INV input, provides address modes) |
| 5 | SELD | Segment Select output, a decoded bit vector of an SAD register value |

| No. | ENA | INV | COM | SELD | Mode |
|---|---|---|---|---|---|
| 1 | 0 | X | X | All 0 | Functional/Test Bypass (TB) |
| 2 | 1 | 0 | 0 | Bit (2^SAD – 1) set, others reset | One Address, ON |
| 3 | 1 | 0 | 1 | Bits 0 to (2^SAD -1) set, others reset | Less than or Equal, LE |
| 4 | 1 | 1 | 0 | Bit (2^SAD – 1) reset, others set | All but One address, AE |
| 5 | 1 | 1 | 1 | Bits 0 to (2^SAD – 1) reset, others set | Greater than, GT |

| No. | ENA (output enable signal) | INV (invert decode signal) | COM (compress mode signal) | TDO (1-bit output signal) | Modes |
|---|---|---|---|---|---|
| 1 | 0 | X | X | 0 | Functional/ Test Bypass (TB) |
| 2 | 1 | 0 | 0 | OR all TQ | One Address (ON)/ Address Increment (AI) |
| 3 | 1 | 0 | 1 | XOR all TQ | Less than or Equal (LE) |
| 4 | 1 | 1 | 0 | XOR all TQ | All Except (AE) |
| 5 | 1 | 1 | 1 | XOR all TQ | Greater Than (GT) |

Figure 20

| No. | Pin | Direction | Description |
|---|---|---|---|
| 1 | TCK | Input | Test clock |
| 2 | CSI | Input | Channel Scan Input |
| 3 | CSO | Output | Channel Scan Output |
| 4 | RST | Input | Test reset global input |
| 5 | SSI | Output | Segment Scan Input |
| 6 | SSO | Input | Segment Scan Output |
| 7 | ASE | Input | Address Shift Enable signal |
| 8 | AIN | Input | Address Increment signal |
| 9 | CIN | Input | Address count enable input (bit vector) |
| 10 | SAD | Output | Segment Address Data (bit vector) |
| 11 | SINV | Output | Segment Invert Data |
| 12 | SCOM | Output | Segment compression mode signal |
| 13 | COUT | Output | Address Count enable output |
| 14 | LLSO | Input | Last Leaf Scan Out |
| 15 | ENA | Input | Block enable |
| 16 | PSI | Input | Previous Segment Input |
| 17 | CLKI | Input | Functional clock input |
| 18 | CLKO | Output | Functional clock output |

Figure 22

| No | Pin | Description |
|----|-----|-------------|
| 1 | TSI | Top Scan Input (test data for scan channel shifts in ) |
| 2 | TCK | Test Clock Input (clock for test circuitry) |
| 3 | OE | Observe Enable input (global enable for observing any state element) |
| 4 | OO | Observe Override input (global enable for monitoring compressed chip state) |
| 5 | CO | Control Override input (global enable for setting/resetting all state elements) |
| 6 | OS | Output Select input (Global control for observing state or next state) |
| 7 | TSO | Top Scan Output (scan channel test data shifting out) |
| 8 | RST | Test reset input (global control to reset test circuitry) |
| 9 | ASE | Address Shift Enable input (global enable to allow shifting of address into LSG) |
| 10 | AIN | Address Increment input (global enable for consecutive state access) |

Figure 23

DESIGN-FOR-TEST TECHNIQUES FOR A DIGITAL ELECTRONIC CIRCUIT

This patent application is a continuation of a patent application entitled "Design-for-Test Techniques for a Digital Electronic Circuit" having Ser. No. 14/570,561 which was filed on Dec. 15, 2014 and which is incorporated herein in its entirety.

TECHNICAL FIELD

One or more embodiments relate to digital electronic circuits ("DCCTs") such as, but not limited to, integrated circuits ("ICs"), that are configured for testing in accordance with a Design-for-Test ("DFT") technique, and to methods for testing such DCCTs, for example, for manufacturing defects.

BACKGROUND

As is well known, a typical Design-for-Test ("DFT") technique for a digital electronic circuit ("DCCT") entails providing a "back-door" mechanism to load and unload data storage cells (for example, flip-flops) of the DCCT. Such a "back-door" mechanism, also referred to herein as a "scan DFT mechanism" simplifies (a) the application of stimuli to circuit elements and storage cells in the DCCT; and (b) the observation of resulting responses from the circuit elements and storage cells in the DCCT. As is also well known, a scan DFT mechanism is implemented in a DCCT during its physical design to provide a scan-mechanism-enabled DCCT by: (a) replacing storage cells in the DCCT with corresponding storage cells having a back-door mechanism (i.e., a scan DFT mechanism); and (b) interconnecting them in a test network to dedicated test input and output pins.

DCCTs are typically designed using standard cells, which standard cells include circuit elements such as logic gates (i.e., AND, OR, NOT, etc.) and data storage cells (also known as memory cells) such as, for example and without limitation, flip-flops, data latches or similar elements. In FIG. 1, each square represents a standard cell, and each dark square represents a data storage cell that has been replaced with an equivalent cell, i.e., a data storage cell having a back-door mechanism (i.e., a scan DFT mechanism). A data storage cell (for example, a flip-flop) having a back-door mechanism (i.e., a scan DFT mechanism) will be referred to herein as a "scan cell." As is well known, Automatic Test Pattern Generation ("ATPG") tools (typically software tools) use the scan DFT mechanism in a scan-mechanism-enabled DCCT to automatically generate manufacturing tests for the DCCT.

Each DCCT is composed of functional blocks that are assembled together hierarchically. This defines its logical hierarchy. Before it is cast into silicon, each DCCT has to be synthesized into a network of standard-cells where each such standard-cell is placed in a two-dimensional grid, and their pins are interconnected by wires. This process is called physical design or Place-and-Route. Physical design is also done hierarchically to mitigate performance and capacity limitations of Place-and-Route software tools. The physical hierarchy of a DCCT is usually much flatter than its logical hierarchy. For example up to ten levels of logical hierarchy is common in modern DCCTs while only two levels of physical hierarchy is usually sufficient.

A serial scan ("SS") DFT technique is typically used in the prior art to provide a back-door mechanism. A typical prior art SS DFT technique involves creating a scan cell for each flip-flop in the DCCT by adding a multiplexor to the data input port of each flip-flop, and interconnecting all the flip-flops in the DCCT, under a test mode, to operate as one or more shift registers. For example, in a test mode, all the flip-flops in the DCCT may be connected in cascade to operate as a single shift register. This is illustrated in FIG. 2 where SI and SO pins indicate scan input test signals and scan output test signals, respectively. Arbitrary test stimuli (i.e., test patterns) can be shifted into the SI pin, and arbitrary responses can be shifted out of the SO pin. As is well known, to reduce cost, the area occupied by circuitry added to a DCCT to implement a DFT technique ought to be reduced. As such, a main advantage of a prior art SS DFT technique is the relatively small area occupied by the circuitry added to implement the SS DFT technique. In particular, the SS DFT technique is ideal if all the flip-flops in a DCCT need to be loaded with stimulus data and response data unloaded for comparison with expected values for each test pattern. However, for large DCCTs, the SS DFT technique is not ideal since only a small fraction of the flip-flops in the DCCT needs to be loaded or unloaded in most test patterns. Since all the flip-flops configured as a shift register in an SS DFT technique need to be clocked in every cycle of a load or unload operation, DCCTs implementing the SS DFT technique dissipate large amounts of power during manufacturing tests, which large amounts of power may degrade or even damage the DCCTs, thereby negatively affecting their reliability or performance.

In contrast to the prior art SS DFT technique, a prior art random access scan ("RAS") DFT technique involves: (a) creating an RAS flip-flop to replace each flip-flop in the DCCT (where an RAS flip-flop is a regular flip-flop with a data input multiplexor and one or more enable inputs (i.e., a demultiplexor)); and (b) adding global multiplexing logic to the DCCT to enable loading or unloading one flip-flop at a time under a test mode. The RAS DFT technique is illustrated in FIG. 3 where the global multiplexing logic comprises multiplexors (i.e., multiplexor logic circuitry) and demultiplexors (i.e., demultiplexor logic circuitry) surrounding the DCCT. As shown in FIG. 3, ADDRESS represents a multi-bit address signal used to select one of the demultiplexors and one corresponding multiplexor so that only one flip-flop is connected between SI and SO signal pins for loading and unloading data, respectively, for that flip-flop. As a result, an arbitrary test stimulus can be applied to each flip-flop from the SI pin and an arbitrary response can be observed from each flip-flop at the SO pin, one flip-flop at a time. Since only flip-flops relevant to a test pattern are loaded or unloaded, leaving others alone, the prior art RAS DFT technique provides the lowest possible power dissipation during manufacturing tests. Typically, as shown in FIG. 3, the multi-bit address signal (ADDRESS), the scan input (SI) and the scan output (SO) are serially accessed to minimize the number of test pins. Most prior art RAS DFT techniques use a two-dimensional (2-D) physical grid layout to address each and every storage element (for example, flip-flop) in a DCCT. This is illustrated in FIG. 4. As indicated in FIG. 4, the scan input is broadcast to all flip-flops in the logic array, and each flip-flop gets a row select and a column select signal, which row select and column select signals act as distributed demultiplexor signals. In addition, all flip-flops, except the selected flip-flop, generate a logical "0" to scan output OR logic, which scan output OR logic thereby acts as a distributed multiplexor. Note that decoded row address, decoded column address, broadcast scan input, and row scan output buses traverse the DCCT. Hence, prior art 2-D RAS DFT techniques increase DCCT cost due to high wiring area overhead. For example, a 2-D grid containing 256 RAS flip-flops will have 4 bit row addresses and 4 bit column addresses, yielding 16 row and column select lines (16×16=256). Typically, as shown in FIG. 4, the row address (RAD), the column address (CAD), the scan input (SI) and the scan output (SO) are serially accessed to minimize the number of test pins. FIG. 5 illustrates a 2-D grid where each rectangular slot represents a sequential cell such as a flip-flop in the DCCT. As one can understand from FIG. 5, in this layout, there are 16 long wires each in the horizontal and vertical directions, totaling 32 long wires.

In some prior art RAS DFT techniques, a 2-D (i.e., row and column) address of a sequential element to be controlled or observed is serially shifted into (row and column) address registers that, in turn, drive (row and column) decoders to reduce test pin count. This is problematic since it increases the test application time ("TAT") when test patterns need to load or unload a large number of sequential elements in the DCCT.

System-On-Chip (SOC) circuits are typically separated into several physical blocks, each of which may represent a DCCT, and each of which physical blocks is separately implemented to overcome capacity limitations of Place-and-Route software tools for physical design implementations. Prior art RAS DFT techniques have been proposed to localize 2-D physical grid layouts to each physical block of the SOC, however, this approach does not effectively mitigate the high wiring area overhead of prior art 2-D RAS DFT techniques for large physical design blocks.

Some prior art RAS DFT techniques use test compression techniques that are implemented using Multiple Input Signature Registers (MISR). However, instead of comparing the output response of a manufactured DCCT against expected individual values from simulation for each test, only a final, compressed response signature, obtained after applying all tests, is compared against an expected signature calculated by circuit simulations. This is done to reduce test application time ("TAT"), and test pattern data volume (TDV) that needs to be handled outside of the DCCT. In digital circuits, a logic value on a signal line would be either 0 or 1. However, in situations where a value cannot be determined as 0 or 1, a symbolic value X is assigned, with the restriction that it is either 0 or 1. ATPG tools use zero delay simulation, and therefore, use the unknown (or unpredictable) value X to model race and hazard signal paths, multi-cycle signal paths, uninitialized memory arrays, and sequential elements that do not have a back-door access mechanism. Since most large DCCTs have some amount of such circuit elements, they make an expected MISR signature calculated by simulation to contain unknown (or unpredictable) X values, thereby causing the test compression techniques to fail on such DCCTs.

As is well known, a test pattern consists of load, capture and unload procedures applied to a DCCT. Further, the test power of a test pattern is the maximum power dissipated during the load, capture and unload procedures. In a test pattern: (a) after required circuit state values have been shifted into flip-flops (in a load procedure), new values of flip-flops (via their output ports) propagate through the DCCT (via the DCCT logic circuitry) and resultant values appear at data input ports of flip-flops; (b) the resultant values are then clocked into the flip-flops (in a capture procedure); and (c) the stored resultant values are finally shifted out to the DCCT (IC chip) test pins and are compared with expected values (in an unload procedure). As one of ordinary skill in the art can readily appreciate, only a small subset of the flip-flops of a DCCT needs to be loaded or unloaded for a typical test pattern. Thus, all prior art RAS DFT techniques reduce power dissipation during load and unload procedures when compared to serial scan DFT techniques since only the subset of flip-flops that need to be loaded or unloaded are operated using the RAS DFT mechanism. However, power reduction during capture procedures has not been addressed in prior art RAS DFT techniques to date.

Test application time ("TAT") and test pattern data volume ("TDV") of prior art SS DFT techniques for DCCTs have been improved by adding scan output compression and scan input decompression logic circuitry to the DCCT. This is illustrated in FIG. 6. In accordance with this improvement, scan input data is compressed a-priori by an ATPG tool to reduce the test pattern data volume. The compressed test stimulus data is decompressed using on-chip decompressors. Further, the response data is compressed on-chip and only the compressed responses are compared with the expected compressed responses calculated by the ATPG tool. Only a small fraction of all flip-flops need to be controlled or observed in each test pattern. So, only a few scan pins can be interfaced to a large number of short serial scan chains to reduce TAT since shorter chains require a smaller number of clock cycles for shifting. However, adverse effects of high test power are still present in such prior art compressed scan ("CS") DFT techniques since all scan cells are still clocked during load and unload procedures.

As seen from the above, prior art SS DFT techniques suffer from high test application time ("TAT"), high test pattern data volume ("TDV") and excessive test power ("TP"). In addition, prior art RAS DFT techniques suffer from high routing area overhead. In further addition, prior art CS DFT techniques suffer from high test power (TP).

SUMMARY

One or more limitations of prior art serial scan ("SS"), prior art random access scan ("RAS") and prior art compressed scan ("CS") DFT techniques are overcome by hierarchical, compressed, random access scan ("CRAS-N") and segmented, random access scan ("SRAS") DFT techniques described herein. In particular, the CRAS-N DFT technique provides a multi-dimensional addressing scheme without upper limits on the number of dimensions in the logical structure of the DCCT, and the SRAS DFT technique provides a logically extensible, hierarchical, multi-level addressing scheme to address each SRAS scan cell individually without upper limits on the number of levels in the logical structure of the DCCT. The SRAS DFT technique also facilitates multiples of hierarchical levels with lower hierarchical structures being reused to build up higher levels of the hierarchy in a reusable architecture scheme for DCCTs. One or more of Test Application Time ("TAT"), Test Pattern Data Volume ("TDV") and Test Power ("TP") may be reduced and/or minimized over those of prior art RAS DFT techniques by one or more embodiments while reducing and/or minimizing cell and wiring area overhead.

BRIEF DESCRIPTION OF THE DRAWINGS

FIG. 13 is a table that specifies the input-output functionality of each port of an SRAS scan cell that is fabricated in accordance with one or more embodiments;

FIG. 14 is a truth table that defines the modes of operation of an SRAS scan cell that is fabricated in accordance with one or more embodiments as a truth table;

FIG. 20 is a table that lists the ports and the port functions of an SAB, and a truth table that defines the Boolean operations of an SAB that is fabricated in accordance with one or more embodiments;

FIG. 22 is a table that lists the ports and the port functions of an SCB that is fabricated in accordance with one or more embodiments;

FIG. 23 is a table that lists the top level test pins and their functions in test circuitry in accordance with one or more embodiments;

DETAILED DESCRIPTION

Figure 7:
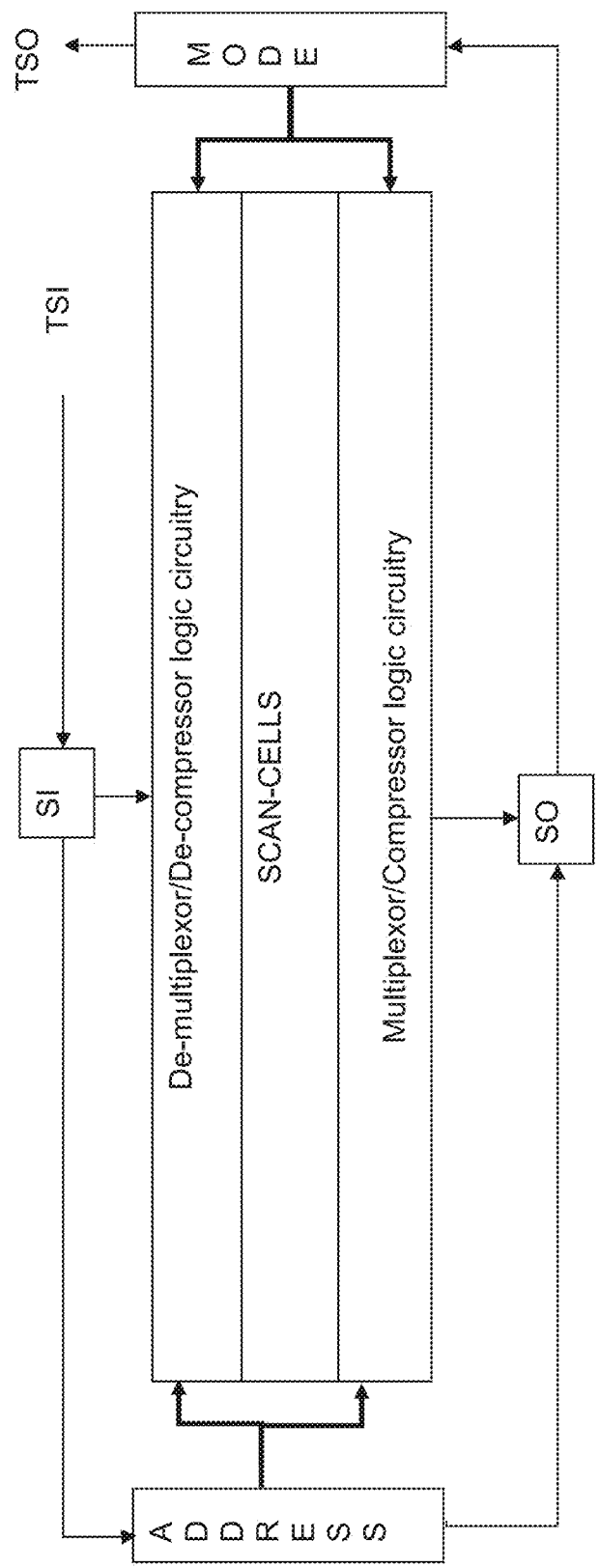
FIG. 7 is a block diagram of an embodiment that is fabricated in accordance with a compressed, random access scan ("CRAS") DFT technique.

FIG. 7 is a block diagram of a digital electronic circuit ("DCCT") such as, but not limited to, integrated circuits ("ICs"), that is configured for testing (for example and without limitation, testing for manufacturing defects) in accordance with an embodiment of an inventive hierarchical, compressed, random access scan ("CRAS") Design-for-Test ("DFT") technique. As shown in FIG. 7: (a) a multiplicity of data storage cells (also referred to as memory cells) such as, for example and without limitation, flip-flops, or data latches or similar elements, have been replaced by scan cells (i.e., data storage cells in the DCCT have been replaced with corresponding data storage cells having a back-door mechanism); (b) global {demultiplexor logic circuitry}/ {decompressor logic circuitry} and global {multiplexor logic circuitry/compressor logic circuitry} surround the DCCT (represented in FIG. 7 by the scan cells); (c) ADDRESS represents a multi-bit address signal used to select one or more scan cells to be connected between signal input ("SI") and signal output ("SO") pins for loading and unloading data, respectively, selected scan cells; and (d) MODE represents a signal that selects between functional, multiplexor-demultiplexor and compressor-decompressor modes of operation. Advantageously, the CRAS DFT technique reduces the test application time ("TAT") and test pattern data volume ("TDV") of prior art RAS DFT techniques. In operation, at an input side of circuitry provided in accordance with the CRAS DFT technique, scan data, compressed a-priori by software in an Automatic Test Pattern Generation ("ATPG") tool (not shown), is shifted into the CRAS DFT technique circuitry via the SI pin, and it is decompressed inside the DCCT (i.e., on the chip) before loading a group of selected scan cells (i.e., data storage cells in the selected scan cells) in the DCCT. At the output side of the circuitry provided in accordance with the CRAS DFT technique, data being unloaded from the group of selected scan cells (i.e., data storage cells in the selected scan cells) is compressed inside the DCCT (i.e., on the chip) before it is shifted out of the CRAS DFT circuitry at the SO pin. Advantageously, this operation allows many scan cells (i.e., data storage cells in the selected scan cells) to be loaded with the same control data in a single (load) operation. Also the state (i.e., value) of many scan cells (i.e., data storage cells in the selected scan cells) can be compressed and observed in one (unload) operation. In accordance with one or more such embodiments, multiplexor/demultiplexor logic is retained for situations where only a few flip-flops need to be controlled or observed. In accordance with one or more such embodiments, a test mode port is added to the DCCT for applying the MODE signal used to select between the functional, multiplexor-demultiplexor and compressor-decompressor modes of operation. Typically, as shown in FIG. 7, the multi-bit address signal (ADDRESS), the MODE signal, the scan input (SI) and the scan output (SO) are serially accessed using TSI and TSO pins to reduce the number of test pins.

In accordance with one or more embodiments, the CRAS DFT technique (i.e., entailing the use of demultiplexor/ decompressor and multiplexor/compressor logic) may be extended to a hierarchy of demultiplexor/decompressor and multiplexor/compressor logic (also referred to as blocks) having an arbitrary number of levels wherein a hierarchy having N levels is referred to herein as an embodiment of an inventive CRAS-N DFT technique. Also, to maintain flexibility, in accordance with one or more embodiments of the CRAS-N DFT technique, the number of blocks (of demultiplexor/decompressor and multiplexor/compressor logic) at each level of the hierarchy does not need to be the same. However, in accordance with one or more embodiments of the CRAS-N DFT technique that are useful for implementation in semiconductor technology, the number of blocks at each level of the hierarchy and the number of storage elements under the lowest block in the hierarchy are the same. Such embodiments are referred to herein as embodiments of a segmented, random access scan ("SRAS") DFT technique. In accordance with one or more embodiments of the SRAS DFT technique, the number of blocks at each level of a hierarchy (and the number of storage elements under the lowest block) is referred to as a segment_size. Hence, for a particular circuit having a particular number of storage elements, the number of levels in the hierarchy and the segment_size are inversely related.

Figure 8:
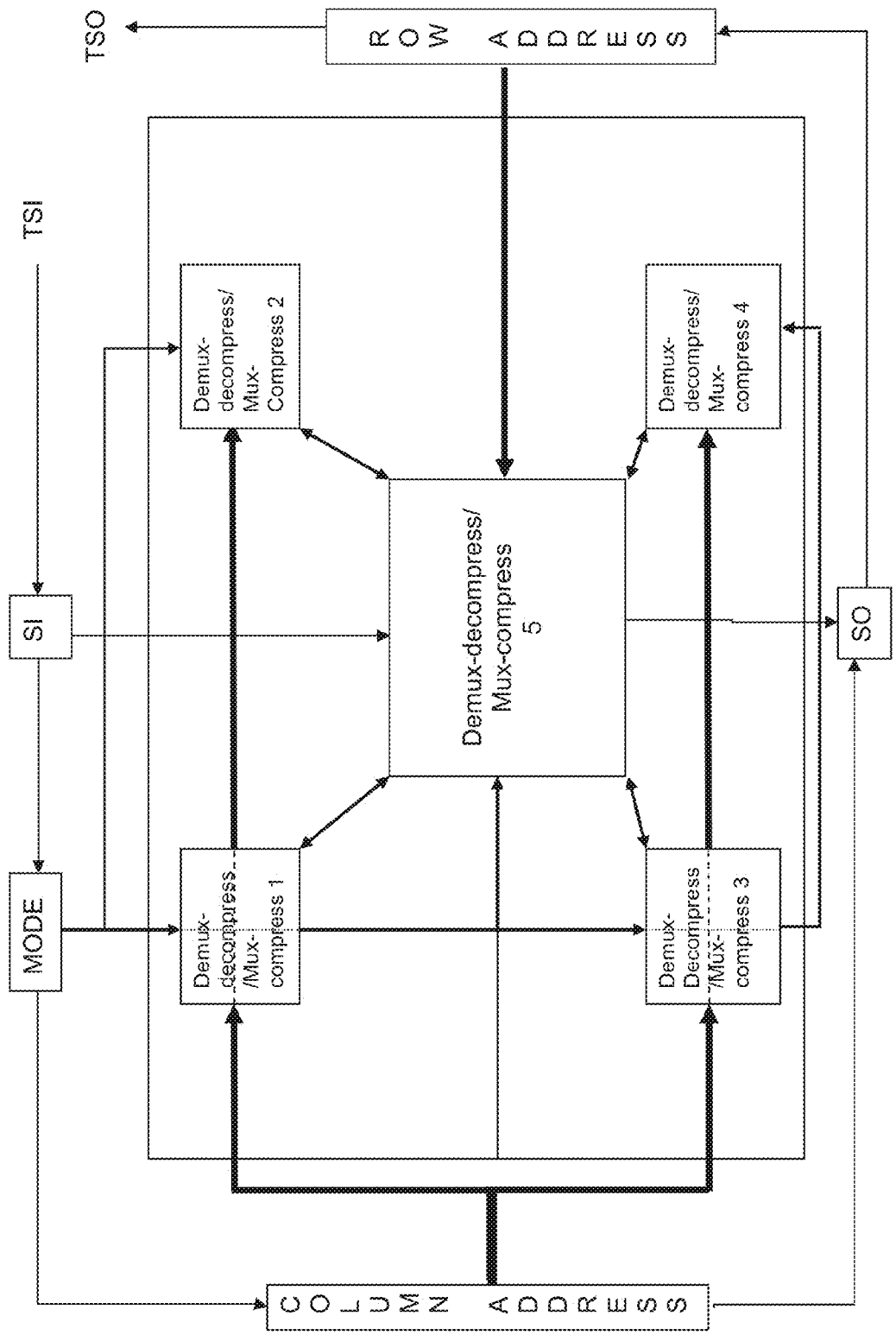
FIG. 8 is a block diagram of an embodiment that is fabricated in accordance with a CRAS-2 DFT technique, i.e., an embodiment having a hierarchy with two levels.

The inventive CRAS-N DFT technique is described next for the case of a hierarchy having two (2) levels (i.e., as such it is referred to here as a CRAS-2 DFT technique). In accordance with one or more embodiments of the CRAS-2 DFT technique, a multiplicity (typically all) of the data storage cells, e.g., flip-flops, have been replaced by scan cells and the DCCT has been partitioned into DCCT circuit blocks wherein each such DCCT circuit block has its own Demultiplexor-Decompressor/Multiplexor-Compressor ("DDMC") circuit block. In addition, and in accordance with one or more such embodiments, a top level DDMC circuit block is used to interface the highest circuit level (i.e., chip level) scan pins to lower level DDMC circuit blocks. FIG. 8 is a block diagram of a DCCT that is configured for testing in accordance with an embodiment of the CRAS-2 DFT technique. As shown in FIG. 8, in accordance with one or more embodiments, the DCCT is partitioned into four (4) sub-circuits of the DCCT disposed, for example and without limitation, in four (4) quadrants. As shown in FIG. 8, and in accordance with one or more such embodiments, each quadrant has its own DDMC circuit block (the DDMC circuit blocks are marked 1 through 4 in FIG. 8). As further shown in FIG. 8, and in accordance with one or more such embodiments, a top level DDMC circuit block (the top level DDMC circuit block is marked 5 in FIG. 8) selects one of the DDMC circuit blocks in the four (4) quadrants using a Row Address ("RA"), i.e., a Row Address Decoder (RAD) in DDMC 5 decodes the RA and generates select signals for one or more of the DDMC circuit blocks in the four (4) quadrants, i.e., for DDMCs 1-4. Further, in accordance with one or more such embodiments, the Column Address (CAD) is broadcast to DDMCs 1-4, and a Column Address Decoder (CAD) in each of DDMCs 1-4 generates select signals for one or more scan cells in a respective quadrant. The ATPG software controls the Column Address (CA) and Row Address (RA) in each test pattern. Note that, in the embodiment of the CRAS DFT technique shown in FIG. 7, decoded address lines may need to traverse the entire area of the DCCT. However, in the embodiment of the CRAS-2 DFT technique shown in FIG. 8, the decoded column address lines need to traverse only the chip area occupied by a single quadrant. Moreover, in the embodiment shown in FIG. 8, the decoded Row Address lines need to be routed from the center of the DCCT, i.e., DDMC 5 to the quadrant level DDMC circuit blocks, thereby limiting their maximum wire lengths. Therefore, the CRAS-2 DFT technique reduces the wiring area overhead of the CRAS DFT technique. Typically, as shown in FIG. 8, the row address (RAD), the column address (CAD), the MODE signal, the scan input (SI) and the scan output (SO) are serially accessed to minimize the number of test pins.

Figure 9:
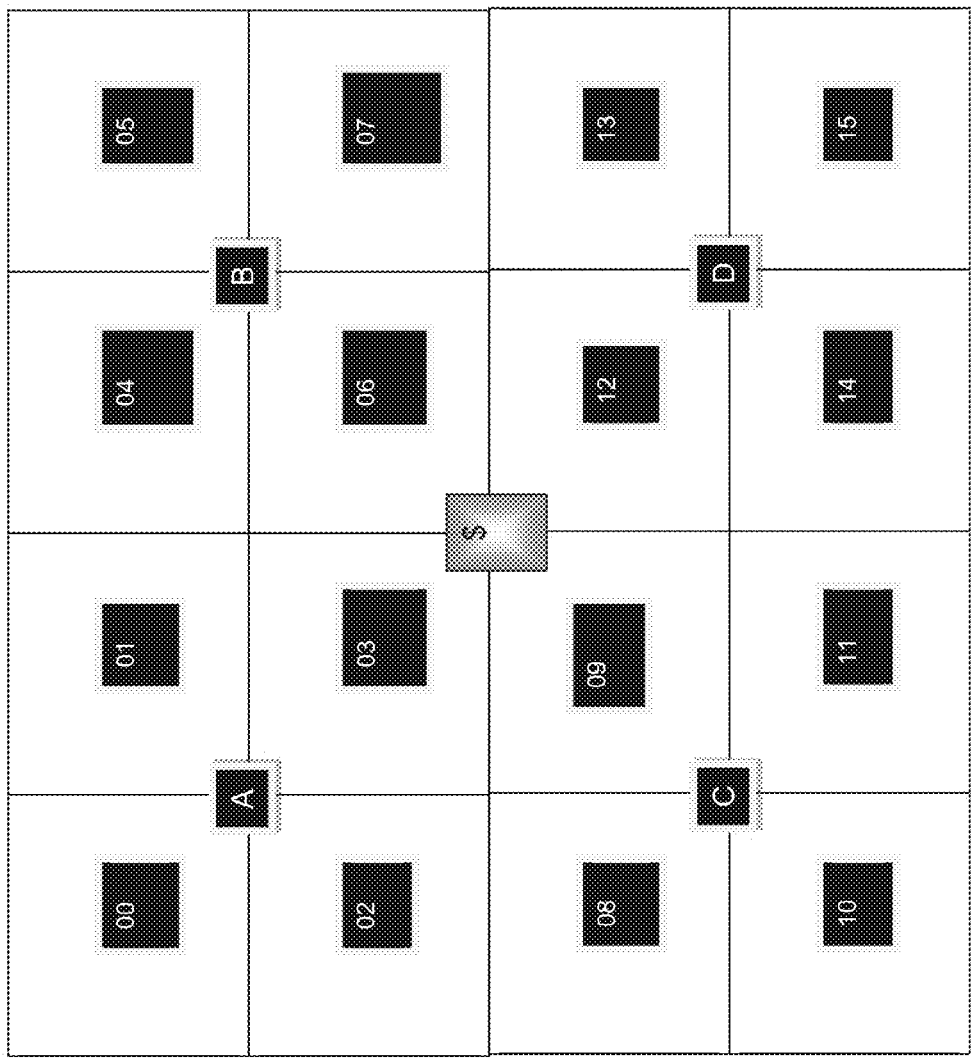
FIG. 9 is a block diagram of an embodiment that is fabricated in accordance with a CRAS-3 DFT technique, i.e., an embodiment having a hierarchy with three levels.

The inventive CRAS-N DFT technique is described next for the case of a hierarchy having three (3) levels (i.e., as such it is referred to here as a CRAS-3 DFT technique). FIG. 9 is a block diagram of a DCCT that is configured for testing in accordance with an embodiment of the CRAS-3 DFT technique. In accordance with one or more embodiments of the CRAS-3 DFT technique, the data storage cells, e.g., flip-flops, have been replaced by scan cells and the DCCT has been partitioned into sub-circuits of the DCCT wherein each DCCT sub-circuit has its own DDMC circuit block (i.e., as shown in FIG. 9, in accordance with one or more embodiments, the DCCT has been partitioned into four (4) sub-circuits of the DCCT disposed in four (4) quadrants wherein each quadrant has its own DDMC circuit block—the DDMC circuit blocks are marked A through D in FIG. 9). In addition, and in accordance with one or more such embodiments, each DCCT sub-circuit has been sub-partitioned into sub-sub-circuits wherein each sub-sub-circuit also has its own DDMC circuit block (i.e., as shown in FIG. 9, in accordance with one or more such embodiments, each quadrant is further divided into four (4) smaller sub-quadrants wherein each sub-quadrant has its own DDMC circuit block—the DDMC circuit blocks are marked 00-03, 04-07, 08-11 and 12-15 in FIG. 9). In further addition, and in accordance with one or more such embodiments, a top level DDMC circuit block is used to interface the highest circuit level (i.e., chip level) scan pins to lower level DDMC circuit blocks—the top level DDMC circuit block is marked $ in FIG. 9. In accordance with one or more embodiments, DDMC $ decodes a Page Address ("PA"), not shown in FIG. 9, and generates select signals for the DDMC circuit blocks in the four (4) quadrants, i.e., DDMCs A-D. In accordance with one or more such embodiments, a Row Address ("RA"), not shown in FIG. 9, is broadcast to each DDMC circuit block in the four (4) quadrants, i.e., DDMCs A-D. A decoder in each of the DDMC circuit blocks in the four (4) quadrants decodes the RA, and generates select signals for the DDMC circuit blocks in the respective sub-quadrants, i.e., DDMCs 00-03, 04-07, 08-11 and 12-15. Finally, in accordance with one or more such embodiments, a Column Address ("CA") (not shown in FIG. 9) is broadcast to DDMCs 00-03, 04-07, 08-11 and 12-15. A decoder in each of DDMCs 00-03, 04-07, 08-11 and 12-15 circuit blocks decodes the CA to generate select signals for the scan cells in the respective sub-quadrant of the DCCT. The ATPG software controls the Column Address (CA), the Row Address (RA) and the Page Address (PA) in each test pattern. Note that in the embodiment of the CRAS DFT technique shown in FIG. 7, decoded address lines may need to traverse the entire area of the DCCT. However, in the embodiment of the CRAS-2 DFT technique shown in FIG. 8, the decoded column address lines need to traverse only the area occupied by a single quadrant. In the embodiment of the CRAS-3 DFT technique shown in FIG. 9, the decoded column address lines need to traverse only the area occupied by a single sub-quadrant. Moreover, in the embodiment of the CRAS-3 DFT technique shown in FIG. 9, the decoded row address lines need to traverse the area occupied by only a single quadrant. Further in the embodiment of the CRAS-3 DFT technique shown in FIG. 9, the decoded page address need to be routed from the center of the chip to the quadrant level DDMC circuit blocks, thereby limiting their maximum wire lengths and congestion. Therefore, the CRAS-3 DFT technique reduces the wiring area overhead of the CRAS-2 DFT technique further. The mode inputs are not shown in FIG. 9 for clarity.

As one can readily appreciate from the above, the inventive CRAS-N DFT technique provides a multi-dimensional addressing scheme without upper limits on the number of dimensions in the logical structure of the DCCT.

Figure 10:
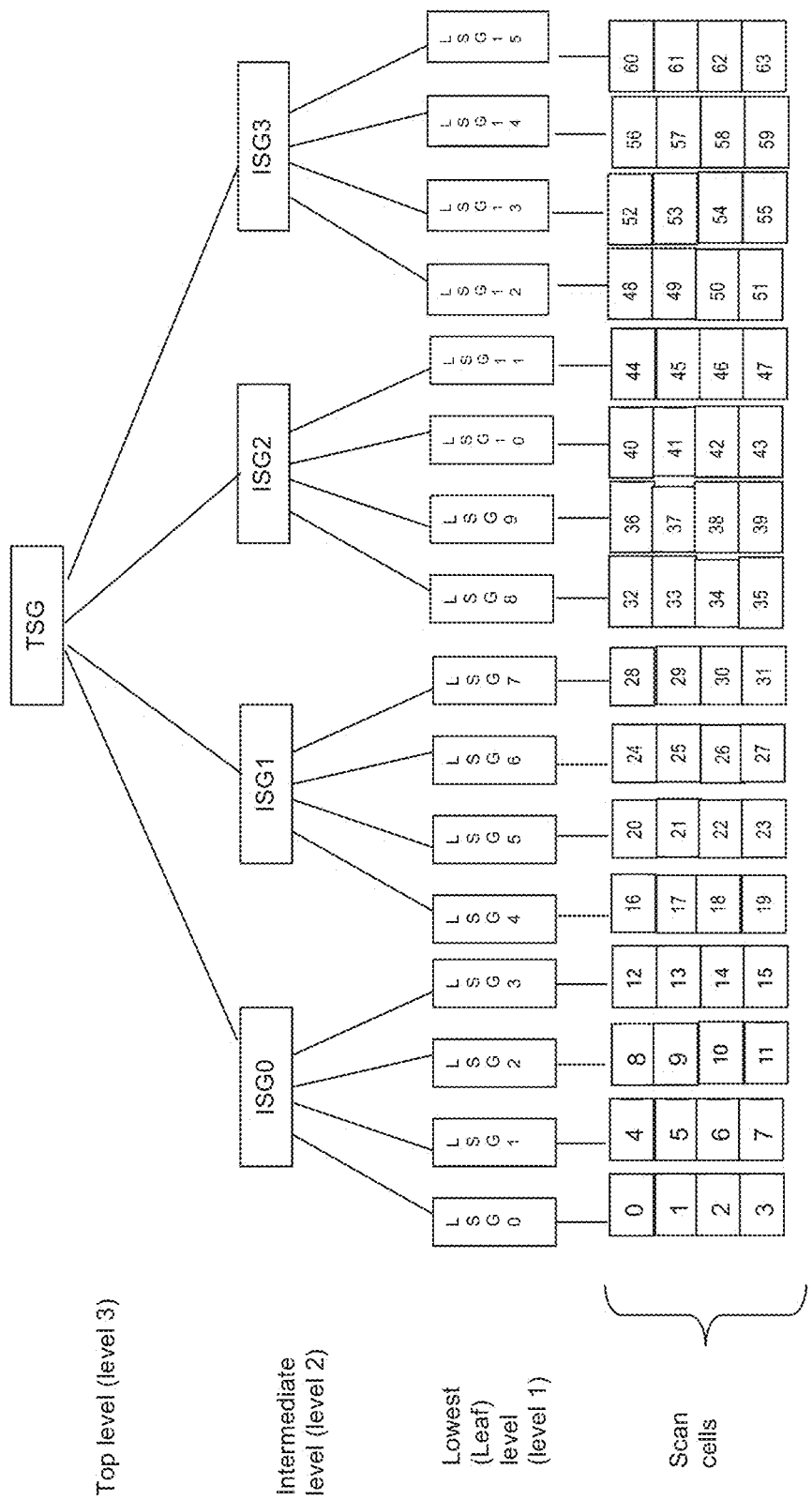
FIG. 10 is a representation of an embodiment that is fabricated in accordance with a segmented, random access scan ("SRAS") DFT technique where the representation takes the form of a tree structure hierarchy having three (3) levels and a segment_size equal to 4.

The CRAS-3 DFT technique can alternatively be represented as a graph with vertices (these are shown as rectangles in FIG. 10) denoting DDMC circuit blocks, and edges (these are shown as straight lines in FIG. 10) denoting the hierarchical relationship between DDMC circuit blocks. FIG. 10 is a representation of an embodiment that is fabricated in accordance with a segmented, random access scan ("SRAS") DFT technique where the representation takes the form of a tree structure hierarchy having three (3) levels and a segment_size equal to 4. In accordance with one or more embodiments of the SRAS DFT technique, the data storage cells of the DCCT, e.g., flip-flops, have been replaced by scan cells. In the representation shown in FIG. 10, Leaf Scan Groups (marked LSG0 through LSG15 in FIG. 10) correspond to the DDMC circuit blocks marked 00 through 15 in FIG. 9. Because the segment_size equals 4, each block in FIG. 10 contains four (4) scan cells. In addition, in the representation shown in FIG. 10, Intermediate Scan Groups marked ISG0 through ISG3 correspond to the DDMC circuit blocks marked A through D in FIG. 9. Lastly, in the representation shown in FIG. 10, the Top Scan Group (marked TSG in FIG. 10) corresponds to the top level DDMC circuit block (marked $ in FIG. 9). The CA, RA, PA and mode inputs are not shown in FIG. 10 for clarity.

Thus, to recap, the lowest level hierarchical block fabricated in accordance with the SRAS DFT technique contains a group of SRAS scan cells and is named a Leaf Scan Group (LSG). The number of SRAS scan cells in an LSG is equal to the segment_size. Further, in accordance with the SRAS DFT technique a number of Leaf Scan Groups (LSGs) can be grouped under an Intermediate Scan Group (ISG). The number of LSGs in an ISG is also equal to the segment_size. The ISGs which are immediately above the LSG in the hierarchy can be combined to create yet another ISG which is just one level higher in the hierarchy than those ISGs. The number of ISGs attached to a single ISG at an immediately higher hierarchy level is also equal to the segment_size. Thus, one or more embodiments includes a logically extensible, hierarchical, addressing scheme to address each SRAS scan cell individually, which SRAS scan cell is always placed at the lowest level in the hierarchy. The top level ISG in the hierarchy is named a Top Scan Group (TSG). The hierarchical addressing scheme can be represented by a rooted, full, N-ary tree, where N is the segment_size, and where the depth of the tree (i.e., the number of levels in the hierarchy) is given by a dimension_count. The tree representation allows efficient tree traversal algorithms such as those found in a book entitled "The Art of Computer Programming Volume 1: Fundamental Algorithms," 3rd edition, by Donald E. Knuth, published on Nov. 14, 1997 by Addison-Wesley Professional, pp. 28-29 and 315-341, to be used for off-chip test compression. Further, the cell area overhead of the SRAS DFT technique can be traded off against routing area overhead by optimizing dimension_count and segment_size for different types of DCCTs.

In accordance with the one or more embodiments of the SRAS DFT technique, an SRAS scan cell is limited to having a single enable signal to create a standard SRAS scan cell that can be used to implement embodiments of the CRAS-N DFT technique for any appropriate value of N. As was shown above, the longest decoded address wire for an embodiment of the CRAS-N DFT technique is shorter than the longest decoded address wire for an embodiment of a CRAS-(N−1) DFT technique. Therefore, by induction, the maximum length of decoded address lines in an embodiment of a CRAS-N DFT technique can be controlled by choosing suitable values for the number of levels (N) in the hierarchy and segment_size. Because the length of the decoded address lines is a primary determinant of wiring area overhead for any RAS DFT technique, embodiments of a CRAS-N (and by extension, an SRAS) DFT technique can be optimized for wiring area overhead by choosing suitable values for the number of levels (N) in the hierarchy and segment_size. The number of levels (N) in the hierarchy in an embodiment of an SRAS DFT technique is referred to herein as the dimension_count. As one can readily appreciate, the inventive SRAS DFT technique provides a multi-level addressing scheme without upper limits on the number of levels in the logical structure of the DCCT. It also facilitates multiples of hierarchy levels with lower hierarchy structures being reused to build up higher levels of hierarchy in a reusable architecture scheme for DCCTs.

Figure 11:
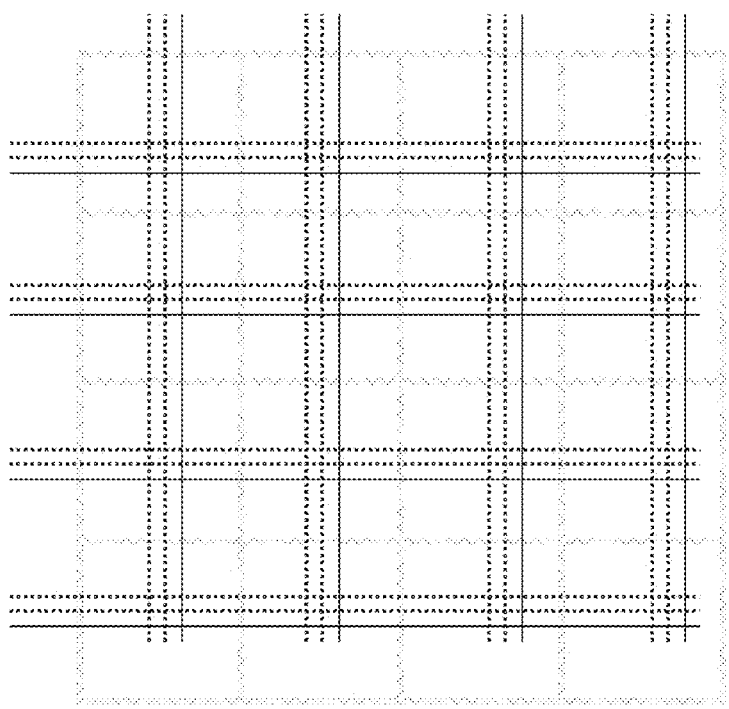
FIG. 11 shows an abstract layout of 256 SRAS scan cells, which layout is implemented in accordance with one or more embodiments of the SRAS DFT technique as a 4×4× 4×4 array.

The following develops a simple quantitative model to estimate the routing overhead of embodiments of a CRAS-4 DFT technique. FIG. 11 shows an abstract layout of 256 CRAS-4 scan cells (i.e., the layout is simplified for ease of understanding this discussion), which layout is implemented as a 4×4×4×4 array of CRAS-4 scan cells. Each of the smallest squares bordered by wavy lines in FIG. 11 denotes a 4×4 array of CRAS-4 scan cells. Four (4) of these adjacent smallest squares (forming a 2×2 array) are combined to make a 4×4×4 quadrant (i.e., sub-circuits), and four (4) of these quadrants are combined to obtain a 4×4×4×4 top level DCCT circuit block that contains 4×4×4×4=256 CRAS-4 scan cells. Imagine that the top level DDMC circuit block (or the TSG in the nomenclature of FIG. 10) is implemented along the top and right edges of the abstract layout. As indicated by the solid lines in FIG. 11, four (4) decoded address wires in the horizontal orientation and in the vertical orientation are needed at the top level to select any smallest square. This requires 4+4 (=8) total decoded address wires at the top level. The two (2) horizontal encoded address wires and the two (2) vertical encoded address wires (indicated by the dotted lines in FIG. 11) going into each smallest square are decoded inside the selected smallest square to access individual CRAS-4 scan cells. Since there is a 4×4 array of squares at the top level, there are eight (8) long (encoded address) wires in the horizontal orientation and eight in the vertical orientation in this embodiment. Note that the encoded address lines in the horizontal and vertical direction are replicated four times each. The number of long wires in an embodiment of the CRAS-4 DFT technique greatly impacts the routing area overhead of a DCCT configured in accordance with the CRAS-4 DFT technique. In accordance with this embodiment, the number of long wires=24 (8+16), whereas the 2-D grid layout illustrated in FIG. 5 has 32 (16+16) long wires. This means that the number of long wires for the embodiment of the CRAS-4 DFT technique has been reduced by 25%, and hence, this has reduced routing congestion with respect to the prior art.

Figure 1:
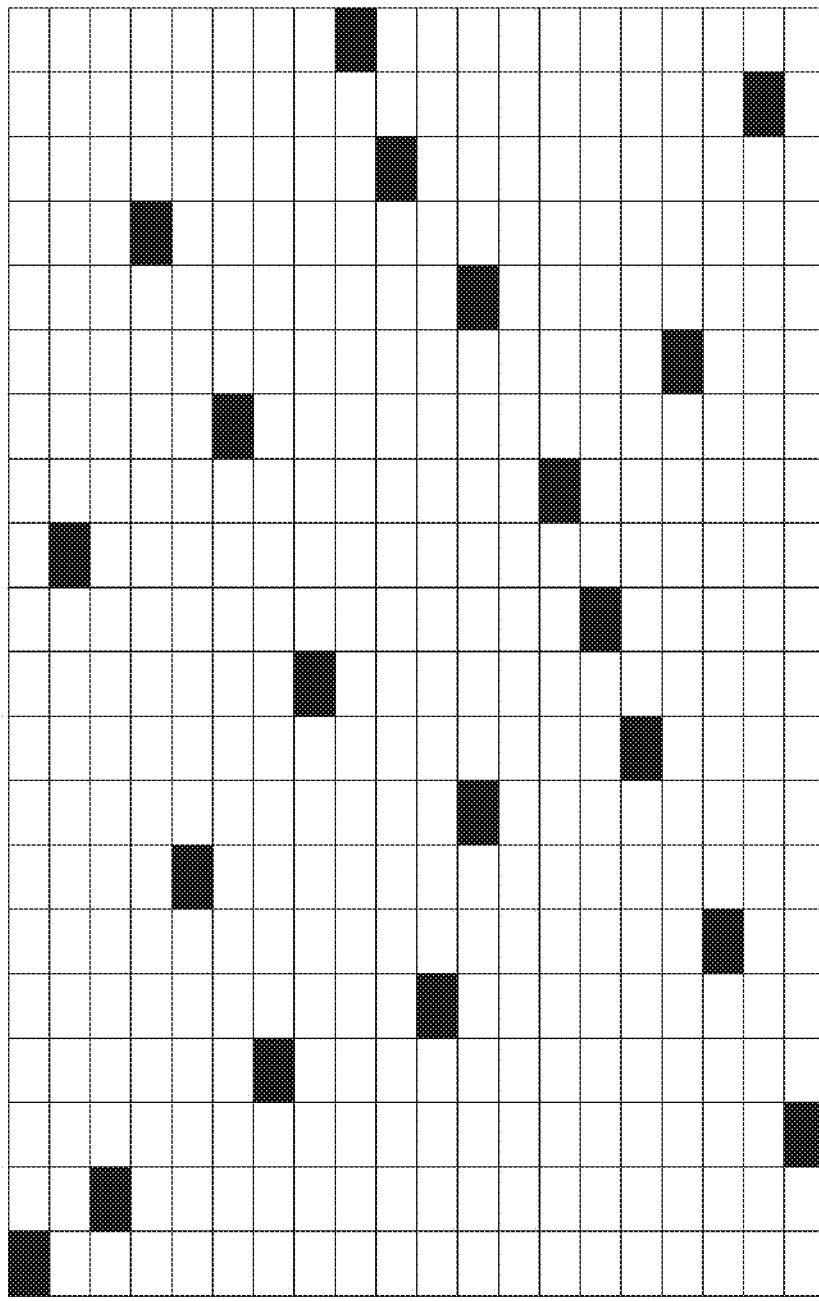
FIG. 1 illustrates a digital electronic circuit ("DCCT") with storage cells highlighted.
Figure 2:
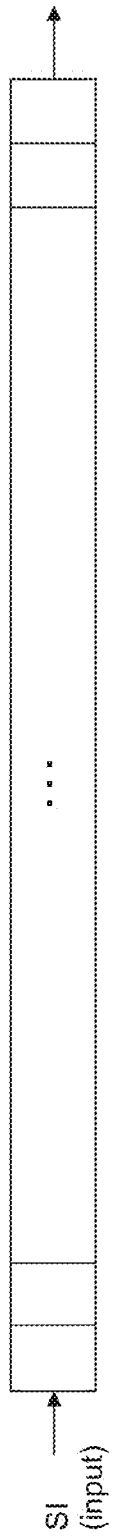
FIG. 2 illustrates the operation of a prior art serial scan ("SS") Design-for-Test ("DFT") technique.
Figure 3:
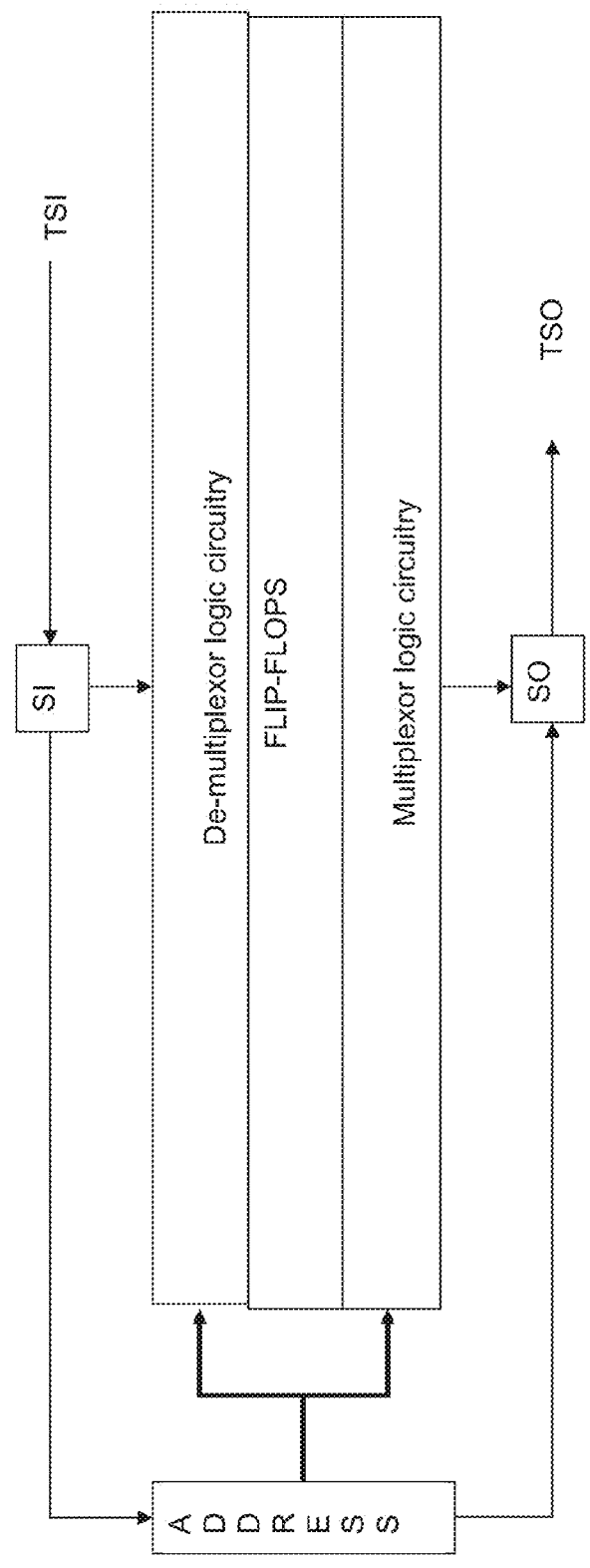
FIG. 3 illustrates the operation of a prior art random access scan ("RAS") DFT technique.
Figure 4:
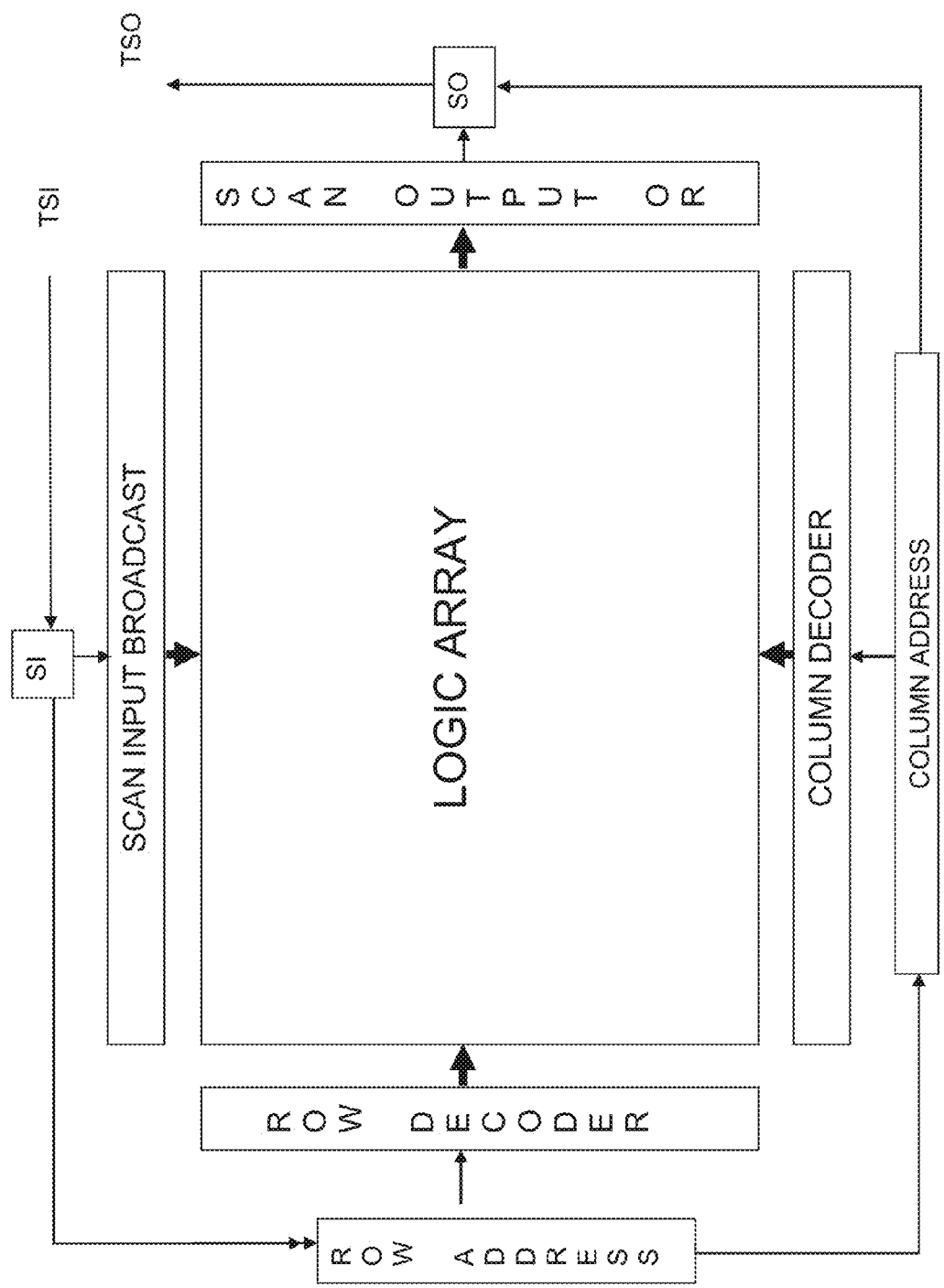
FIG. 4 illustrates the operation of a prior art two dimensional (2-D) RAS DFT technique.
Figure 5:
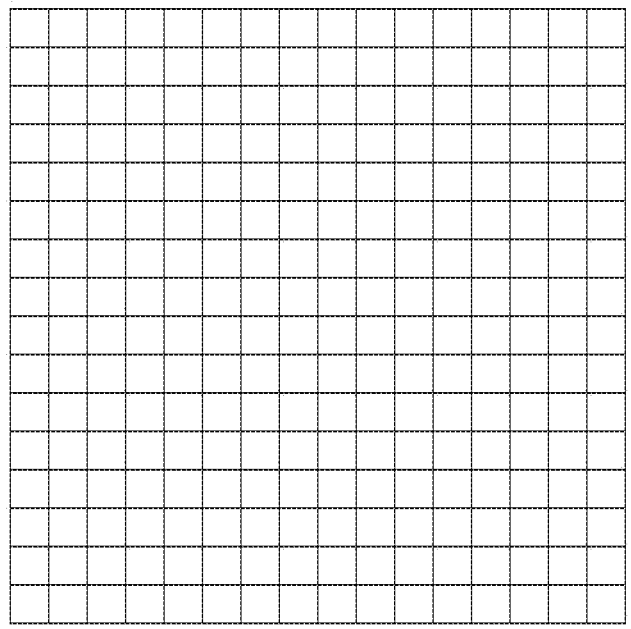
FIG. 5 shows a 2-D grid layout according to the prior art where each rectangular slot represents a sequential (storage) cell in a DCCT.
Figure 6:
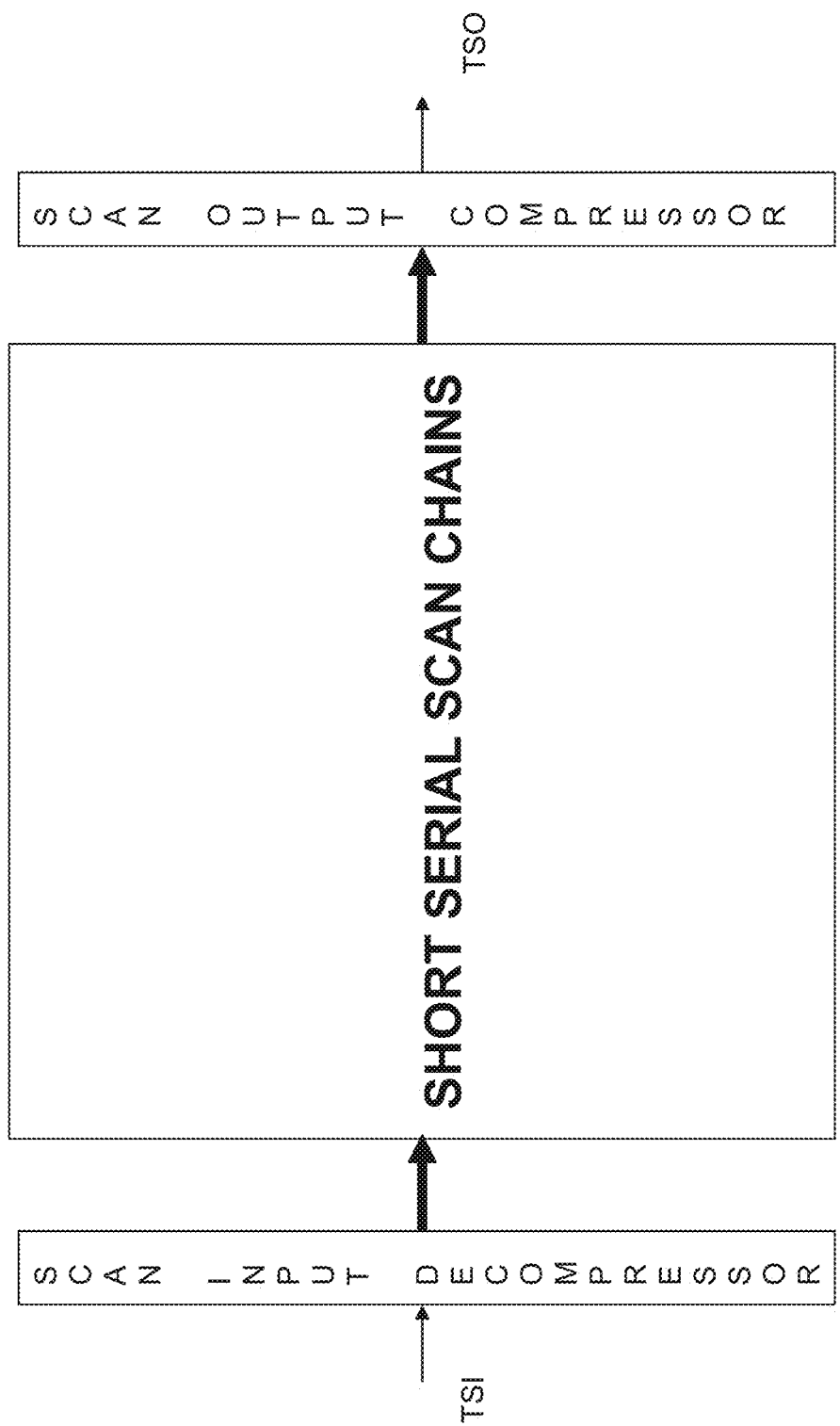
FIG. 6 illustrates the operation of a prior art compressed SS DFT technique.

In a similar manner, a 256×256 2-D sequential cell array can be organized as a four (4) dimensional 16×16×16×16 array (similar to FIG. 11), thus reducing the number of long wires from 512 (256 lines per original dimension side—horizontal and vertical similar to FIG. 5) to 160 (four encoded and one decoded address wire per horizontal and vertical slice, and there being 16 horizontal and 16 vertical slices, 160=(4+1)×16×2) for a 68% reduction with respect to the prior art. Further, this demonstrates that the routing area overhead of an embodiment of CRAS-4 DFT technique improves as DCCT size increases.

The calculations above show that routing area overhead in an embodiment of the CRAS-N DFT technique can be reduced by increasing the dimension_count N. However, cell area overhead increases with dimension_count due to the extra DDMC circuit blocks that need to be added at each level of hierarchy. The inventors have discovered that a dimension_count between 2 and 8 is sufficient for practical DCCTs. Hence, the total area overhead for an embodiment of an CRAS-N DFT technique can be estimated for each of these 7 scenarios (of 2-8 dimension_count), which estimates can be used to choose an optimum dimension_count. The segment_size can then be calculated based on the equation, number of scan_cells<=(segment_size^N), where ^N denotes to the exponential power of N. Alternatively, segment_size can be set to be the square root of the minimum number of storage elements in all leaf physical blocks in the DCCT. This is based on the idea that the smallest leaf physical block should have at most segment_size LSGs. Segment_size should be a power of 2 to minimize the cell area overhead of CRAS-N scan cells. The inventors have discovered that a segment_size between 4 and 256 is sufficient for all practical DCCTs. Thus, to recap, the SRAS DFT technique is characterized by two parameters, dimension_count and segment_size. The dimension_count gives the number of addressing dimensions while segment_size dictates how many SRAS scan cells or other SRAS structure blocks are combined together for that dimension at each hierarchy level. Usually, the segment_size is a power of 2, and is kept fixed for ease of implementation at all hierarchy levels.

There are several steps involved in physically implementing an embodiment of the SRAS DFT technique. The first step involved in physically implementing an embodiment of the SRAS DFT technique entails replacing one or more (typically all) of the data storage cells in the DCCT with corresponding storage cells having a back-door mechanism, for example, SRAS scan cells. In accordance with one or more such embodiments, an SRAS scan cell contains a data storage element (also known as a memory element) such as, for example and without limitation, a flip-flop, a data latch or a similar element. The next step involved in physically implementing an embodiment of the SRAS DFT technique entails assigning the SRAS scan cells to Leaf Scan Groups (LSGs). The following describes an algorithm for assigning SRAS scan cells to LSGs that minimizes inter-physical block test wiring. It uses the number of SRAS cells in a physical block and the physical location of the SRAS cells in it.

Figure 12:
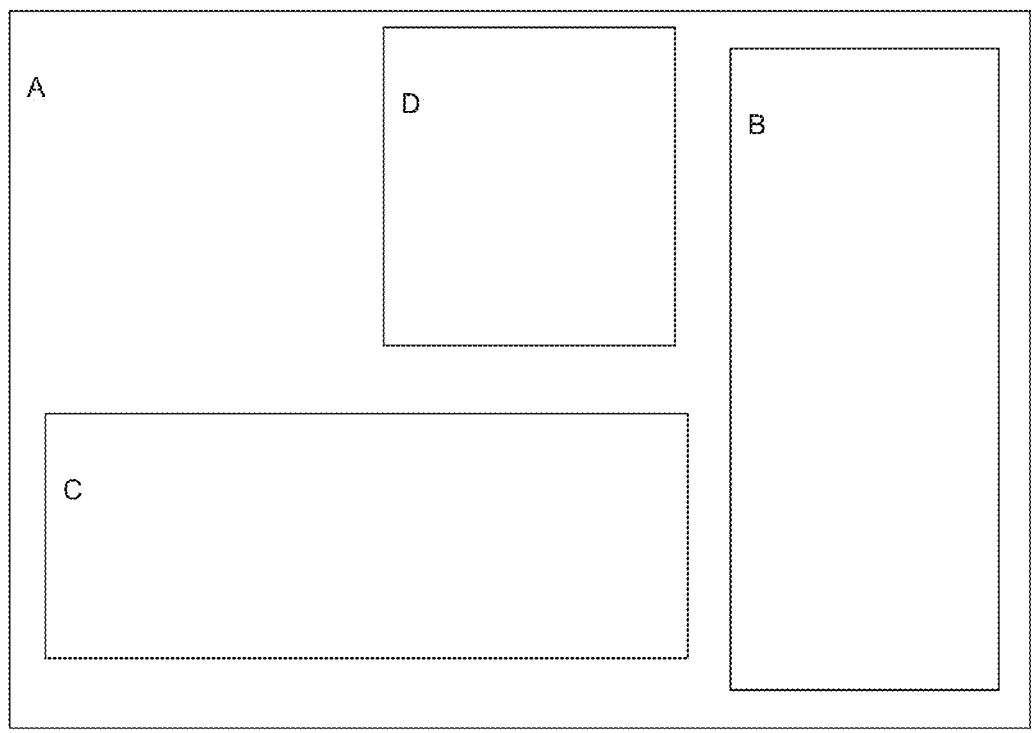
FIG. 12 illustrates the physical implementation of a DCCT in a two level hierarchy.

The algorithm is presented for a DCCT implemented as a two level physical hierarchy shown in FIG. 12. As shown in FIG. 12, the DCCT is composed of physical blocks A, B, C and D. All blocks A, B, C and D contain scan cells, and A is the top physical block. The algorithm can be extended to DCCTs implemented with three or more physical hierarchy levels in a recursive manner.

| 1 | | For each physical block A, B, C, and D |
|---|---|---|
| 1 | A | Calculate the number of scan cells, divide by segment_size and round up to say P, i.e., the number of LSGs in the physical block. |
| 1 | B | Pick any scan cell, calculate the closest segment_size scan cells to it and assign them to an LSG. The LSG is placed at the average X and Y co-ordinate of all scan cells associated with the LSG. |
| 1 | C | Repeat the previous step until all the scan cells are associated with some LSG. |
| 1 | D | Exit if the number of LSGs (P) is 1. |
| 1 | E | Divide the LSG count P by segment_size and round up to say Q, i.e., the number of first level ISGs in the physical block. |
| 1 | F | Pick any LSG and calculate the closest segment_size LSGs to it and assign them to a first level ISG. The first level ISG is placed at the average X and Y co-ordinate of all LSGs associated with the ISG. |
| 1 | G | Repeat the previous step until all LSGs are associated with a first level ISG. |
| 1 | H | Exit if the number of first level ISGs (Q) is 1. |
| 1 | I | Divide the first level ISG count Q by segment_size and round up to say R, i.e., the number of second level ISGs in the physical block. |
| 1 | J | Pick any first level ISG and calculate the closest segment_size first level ISGs to it and assign them to a second level ISG. The second level ISG is placed at the average X and Y co-ordinates of all the first level ISGs associated with the second level ISG. |
| 1 | K | Repeat the previous step until all first level ISGs are associated with a second level ISG. |
| 1 | L | Exit if the number of second level ISGs (R) is 1. |
| 1 | M | Repeat steps I to L for the next level ISG until you have the number of higher level ISGs is 1. |
| 1 | N | Assign a rank to the physical block equal to the highest hierarchical level of all ISGs in it. If there are no ISGs in the physical block, give it a rank of 0. |
| 2 | | Sort physical blocks by increasing rank say C, A, B, D |
| 3 | | For each physical block in increasing rank order say C, A, B, D |
| 3 | A | Attach its highest level ISG to the next higher level ISG in the next higher rank physical block if possible (say A). |
| 3 | B | Repeat the previous step until no more higher rank physical blocks are available (say B). |
| 3 | C | If the previous steps are unsuccessful (i.e., the highest level ISG of the current physical block cannot be attached to a higher level ISG in another physical block (e.g., if all the physical blocks have the same rank), mark the physical block for post-processing. |

4  If there is only one (1) physical block marked for pre-processing, bring the ports of its highest level ISG to the top level, and exit.
5  Else, Create an ISG at a rank one greater than the physical block with greatest rank (say D) in top physical block A, and attach the highest level ISG of the physical blocks marked for post processing to it.

The execution of the algorithm can be illustrated by assuming that block C in FIG. 12 has 1,024 scan cells, block A has 4,096 scan cells, block B has 16,384 scan cells and block D has 65,536 scan cells. Assume the segment_size is 64. Therefore, after step 1 of the algorithm, block C has 16 (1024/64) LSGs and 1 (16/64) ISG. Similarly block A has 64 (4,096/64) LSGs and 1 (64/64) ISG. Likewise, block B has 256 (16,384/64) LSGs, 4 (256/64) first level ISGs, and 1 (4/64) second level ISG. Finally block D has 1,024 (65,536/64) LSGs, 16 (1,024/64) first level ISGs and 1 (16/64) second level ISG. During step 2 of the algorithm, the first level ISGs in blocks C and A are attached to the second level ISG in block B. In step 3.C, blocks B and D are marked for post-processing. Finally, according to step 5, a third level ISG (TSG) is created in top physical block A, and it is connected to the second level ISGs in blocks B and D.

Only a small fraction of scan cells in the DCCT needs to be loaded or unloaded in most scan test patterns. However, in a few scan test patterns almost all the scan cells in the DCCT need to be loaded or unloaded. As was discussed in the Background of the Invention, the test application time ("TAT") of such scan test patterns for an embodiment of a prior art RAS DFT technique is worse than that for an embodiment of a prior art SS DFT technique due to the additional overhead of shifting in scan cell addresses for each scan cell that needs to be loaded or unloaded. This limitation of prior art RAS DFT techniques can be overcome by adding a mode of operation called an Address Increment (AI) mode of operation in which the scan cell address (for example, CA, RA and PA for CRAS-3) is incremented automatically in each load or unload cycle. In this Address Increment (AI) mode of operation, a new scan input value is loaded and a new scan output value is unloaded in each cycle, in a manner similar to prior art SS DFT techniques. Test patterns where most of the scan cells need to be controlled or observed can be applied with lower test time using this mode.

In accordance with one or more embodiments of a CRAS-N DFT technique, multiple compression and decompression modes can be implemented in the DDMC circuit blocks of FIG. 8 to further reduce TAT and TDV over single mode compression-decompression. Hence, in accordance with one or more embodiments of an SRAS DFT technique, an LSG, an ISG and a TSG have seven (7) modes of operation: (a) (normal) Functional; (b) Address Increment (AI); (c) Test Bypass (TB); (d) One Address (ON); (e) Less Than or Equal Address (LE); (f) Greater Than Address (GT); and (g) All Except Address (AE). The ON, LE, GT and AE modes of operation are collectively referred to as the "shift" modes of operation. In accordance with one or more such embodiments, the different modes of operation of the LSGs/ISGs/TSGs can be used to enable ATPG software to choose the most efficient scan-compression method for each test pattern. In particular, the selected compression method should prevent any unknown value (X) from being tolerated to make test signatures consist only of known values (i.e., no unknown X values). If a large percentage of all scan cells in the DCCT need to be loaded or unloaded in a particular test, the Address Increment (AI) mode of operation can be enabled and the internal scan address register can be incremented from a minimum value to a maximum value while applying the scan input data and observing the scan output data at chip pins in each test clock cycle. This mitigates the test application time penalty of a random access scan compared to a serial scan while loading or unloading a large percentage of the scan cells in a DCCT. If a test application is focused on part of the DCCT, the remaining part of the DCCT may be kept in the Test Bypass (TB) mode to reduce shift register length, thereby reducing test application time (TAT) and test power. If one scan cell in the DCCT needs to be controlled or observed in a test pattern, the scan cell address and scan input data is shifted in, and the scan output data is shifted out. This is called the One Address (ON) mode of operation. If all the scan cells that need to be controlled in a test pattern need the same value (i.e., all 0 or all 1), and if all the scan cells that need to be controlled or observed in the pattern are such that the state of all lower or equal addressed scan cells are known, the largest address of all the controlled or observed scan cells and scan input data is shifted in, and the exclusive-OR of all the states of all the scan cells at an address that is less than or equal to the specified address is shifted out (unload). This Less Than or Equal Address (LE) mode of operation sets or resets all scan cells whose address is less than or equal to the specified address (load). If all the scan cells that need to be controlled in a test pattern need the same value (i.e., all 0 or all 1), and if all the scan cells that need to be controlled or observed in the pattern are such that the state of all greater addressed scan cells are known, the smallest address of all the controlled or observed scan cells and scan input data is shifted in, and the exclusive-OR of all the states of all the scan cells at an address that is greater than the specified address is shifted out (unload). This Greater Than Address (GT) mode of operation sets or resets all scan cells whose address is greater than the specified address (load). If all the scan cells that need to be controlled in a test pattern need the same value (i.e., all 0 or all 1), and if only one of the SRAS scan cells in an LSG has an unknown value in a particular test, the address of the scan cell with the unknown value and the scan input data is shifted in, and the exclusive-OR of all the states of all scan cells except that the one with the specified address is shifted out (unload). This All Except Address (AE) mode of operation sets or resets all scan cells except the one with the specified address (load).

For simplicity, in accordance with one or more embodiments, the compression mode is also shifted in/out along with the scan address, the scan input value and the scan output value. Each shift operation can correspond to a load, unload or load-unload operation. Usually, the load of the current pattern is overlapped with the unload of the previous test pattern to reduce test application time. However, this is not always possible due to conflicting scan address and compression mode between consecutive patterns. In addition, multiple load or unload operations may be needed to load and unload all relevant scan cells in a test pattern in the presence of unknown (X) values. For example, if scan cells with address value 10 through 20 are unknown (X), and all other scan cells need to be observed in the current test pattern, a Greater Than Address (GT) mode of operation for unload operation with address 20 is used to observe scan cells 21 and above, and a Less or Equal Address (LE) mode of operation for unload operation with address 9 is used to observe scan cells 0-9. Also, if the scan cells that need to be controlled in a test pattern do not all have the same control value, multiple load operations are needed for the test pattern. In the worst case (for test application time), each scan cell that needs to be controlled or observed in the test pattern needs to be accessed using the One Address (ON) mode of operation. The implementation of the different modes of operation in the building blocks SSB, SAB and SCB are described next in more detail.

As was described above, one or more embodiments of the SRAS DFT technique can be implemented using SRAS scan cells. FIG. 13 is a table that specifies the input-output functionality of each port of an embodiment of an SRAS scan cell that is fabricated in accordance with one or more embodiments. In FIG. 13, in accordance with one or more such embodiments, all signals (the signals are listed under the designation "Pin" in the table) are active high, and the Control Override input signal (CO), the Observe Enable input signal (OE), the Observe Override input signal (OO) and the Output Select input signal (OS) are optional. The functionality of each pin is summarized in the column entitled "Function" in FIG. 13.

FIG. 14 is a truth table of an SRAS scan cell that is fabricated in accordance with one or more embodiments. In the table of FIG. 14, the symbol ˆ denotes the active edge of a clock pulse, A denotes the current input value (0 or 1) and A' denotes the previous output value. Row 1 of the truth table denotes the functional capture state where, on the positive edge of functional clock (CLK), the functional data (D) input is captured into the flip-flop and the functional output Q and the test output TQ are updated. Row 2 of the truth table denotes that when the functional clock (CLK) and the test clock (TCK) are held to 0, the previous state is maintained. Rows 3 and 4 of the truth table denote the test output disable state wherein TQ is forced to 0. The test output disable state of Row 3 is entered by de-asserting the Observe Enable (OE) signal. The test output disable state of Row 4 is entered by de-asserting the Cell Select (CS) signal and the Observe Override (OO) signal. The test output disable state can be used to minimize power dissipation in test logic during functional operation. Row 5 of the truth table denotes the test capture state where, on the positive edge of the test clock (TCK), the test data applied as input to (SI) is captured into the flip-flop and the functional output Q and the test output TQ are updated. Rows 6 and 7 of the truth table denote the All Output Select state, that selects all scan cells for observation. The All Output Select state of Row 6 is entered by activating both the Control Override (CO) and the Observe Override (OO) signals. The All Output Select state of Row 7 is entered by activating both the Cell Select (CS) and the Observe Override (OO) signals. The All Output Select state can be used to monitor the behavior of the functional logic during functional operation. Row 8 of the truth table denotes the Set/Reset All state where all scan cells are set or reset, depending on the state of SI, by the assertion of the Control Override (CO) signal. The Set/Reset All state can be used to initialize the DCCT to the all 0 or all 1 state. Row 9 of the truth table denotes the Disable Capture state entered by de-asserting the Cell Select (CS) signal. The Disable Capture state can be used to prevent the flip-flop from capturing either functional (D) or test (SI) data. Rows 10 and 11 of the truth table denote the Scan Bypass state where the test input SI is propagated to the test output TQ, bypassing the latches, by disabling the functional clock (CLK) and activating the test clock (TCK). The Scan Bypass state is useful for verifying the test logic independently of the functional logic. Rows 12 and 13 of the truth table denote the Functional Bypass state where functional input (D) is propagated to the test output (TQ), bypassing the latches in SRAS scan cell, by disabling the test clock (TCK) and activating the functional (CLK). The functional bypass state is useful for detecting faults in the logic feeding the D input when there is a race path to the latches. Row 14 of the truth table denotes the No Operation (NOP) state where the cell is deselected, but the outputs hold state.

Figure 15:
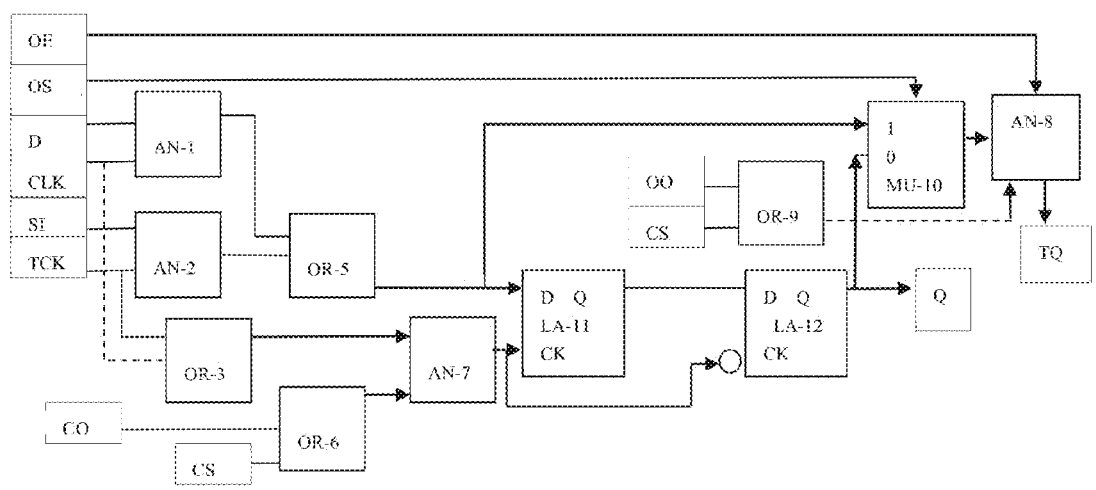
FIG. 15 is a schematic diagram of an SRAS scan cell that is fabricated in accordance with one or more embodiments.

FIG. 15 is a schematic diagram of an SRAS scan cell that is fabricated in accordance with one or more embodiments. Note that, as stated above, the Control Override (CO), Observe Enable (OE), Observe Override (OO) and Output Select (OS) input signals are optional. Correspondingly, OR-6, OR-9 and MU-10 in FIG. 15 are optional too. The type of logic elements that make up the circuit of the SRAS scan cell are labeled inside the logic elements in FIG. 15. In particular, the label "AN" represents the logical AND operation, while the label "OR" represents the logical OR operation. The two boxes labeled "LA" indicate data latch type sequential logic elements with D as an input data pin, Q as a data output pin, and CK as a level sensitive clock pin. When a CK clock signal is at a logic signal value 1, data at D gets stored into the latch and appears at the Q pin after a slight propagation delay. The small circle at the CK pin of LA-12 implies a logical inversion operation on the signal coming into the CK pin, thereby making 0 on the CK pin as the active level. When a DCCT is in a test mode, the SRAS scan cell can only be loaded 1 (or 0) by setting: SI to 1 (or 0), respectively; CS to 1; CO to 0; and by pulsing the TCK clock signal. The stored data value of the SRAS scan cell (i.e., the Q pin of latch LA-12, or the D pin of latch LA-11) can be observed at the TQ test output port by assigning logic 1 to CS, and logic 0 to each of the OE, OO and OS ports. As shown in FIG. 15, setting those values on CS, OE, OO, and OS opens a path through multiplexer MU-10 and gate AN-8. Therefore, it is possible to control and observe an SRAS scan cell state (i.e. the Q value of LA-12) without using the functional ports (i.e., non-test ports) such as D, CLK and Q of the SRAS scan cell. Those functional ports were the original ports of the storage cell replaced by the SRAS scan cell. As a result, the SRAS scan cell shown in FIG. 15 can be used to provide a back-door mechanism to load and unload storage cells in a DCCT.

As was described above, one or more embodiments of the SRAS DFT technique can be implemented using LSGs, ISGs and TSGs. Further, in accordance with one or more such embodiments, an LSG includes: (a) a Segment Selector Block (SSB); (b) a Segment Accumulator Block (SAB); and (c) a Segment Control Block (SCB). As will be described in further detail below, in accordance with one or more such embodiments, in the LSG, the SSB selects one or more SRAS scan cells in a group of segment_size (as an example, let the segment_size be four (4)) to load or unload, based on its or their segment address and compression mode inputs. Further, in accordance with one or more such embodiments, in the LSG, the SAB accumulates the state of one or more SRAS scan cells in a group of segment_size (as an example, segment_size is four (4)). Still further, in accordance with one or more such embodiments, in the LSG, the SCB controls the operation of a group of segment_size (as an example, segment_size is four (4)) SRAS scan cells. In essence then, the SSB and SAB implement the Demultiplexor-Decompressor/Multiplexor-Compressor (DDMC) circuit blocks shown in FIG. 8. Hence, as will be described in further detail below, in accordance with one or more embodiments: (a) for a group of segment_size (for example, segment_size is 4) SRAS scan cells, an SSB, an SAB and an SCB are used to implement a Leaf Scan Group (LSG) shown in FIG. 10; (b) for a group of segment_size LSGs, an SSB, an SAB and an SCB are used to implement an Intermediate Scan Group (ISG) shown in FIG. 10; and (c) for a group of segment_size ISGs, an SSB, an SAB and an SCB are used to implement a Top Scan Group (TSG) shown in FIG. 10.

Figures 16, 17:
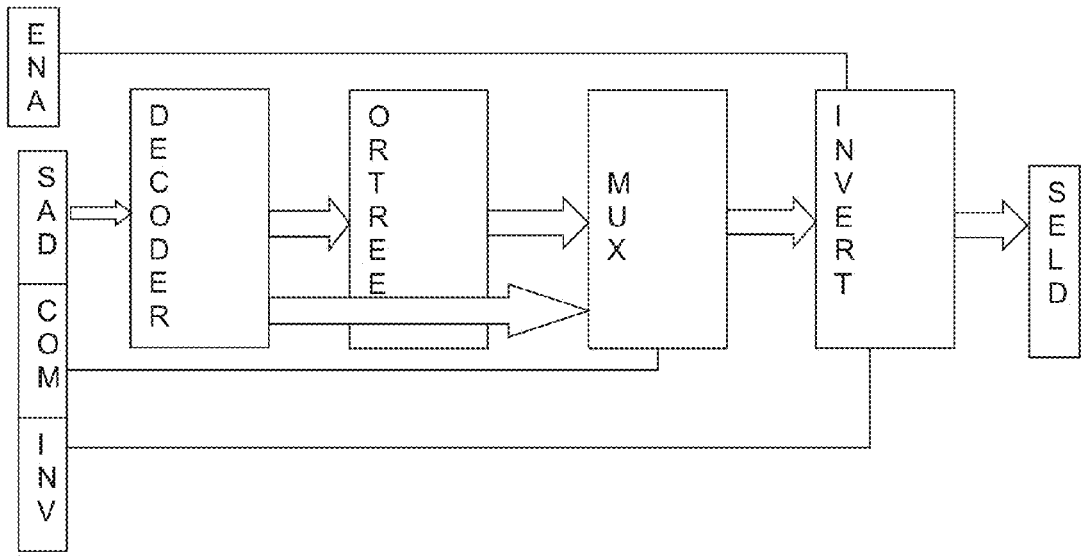
FIG. 16 is a block diagram a Segment Selector Block (SSB) that is fabricated in accordance with one or more embodiments.
FIG. 17 is a table that lists the ports and the port functions of an SSB in accordance with one or more embodiments.
Figures 18, 19:
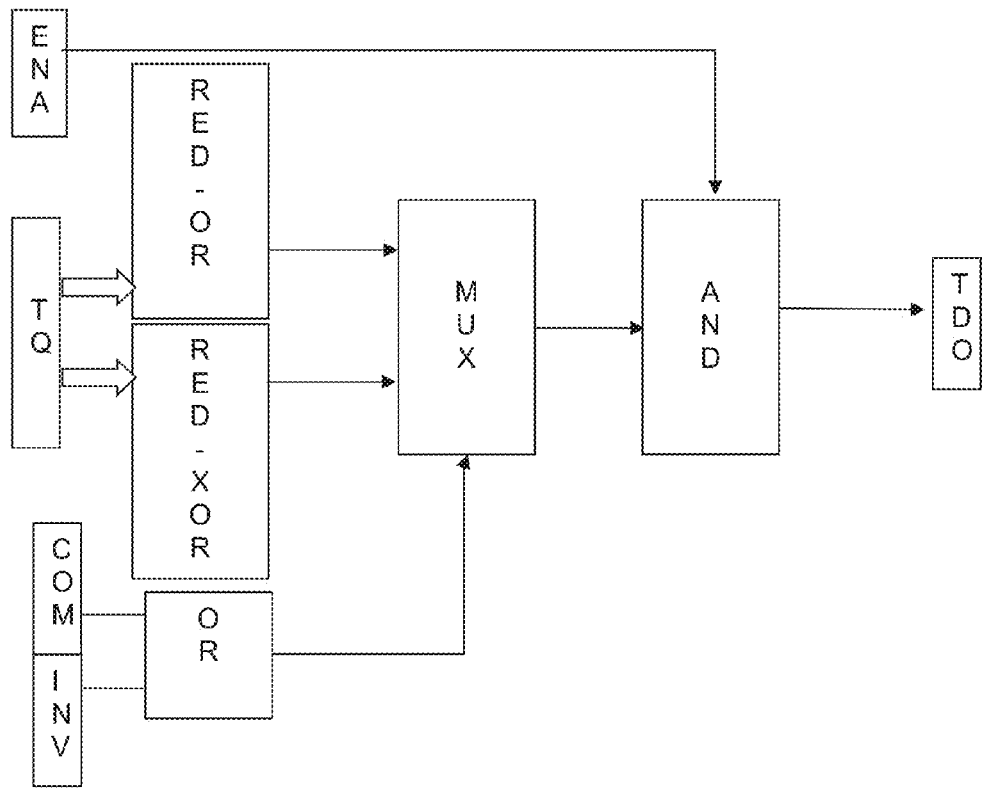
FIG. 18 is a table that defines the operation of an SSB that is fabricated in accordance with one or more embodiments as a truth table.
FIG. 19 is a block diagram of a Segment Accumulator Block (SAB) that is fabricated in accordance with one or more embodiments.

The following describes an embodiment of an SSB, an SAB and an SCB. In particular, FIG. 16 is a block diagram of a Segment Selector Block ("SSB") that is fabricated in accordance with one or more embodiments; FIG. 17 is a table that lists the ports and the port functions of an SSB in accordance with one or more embodiments; and FIG. 18 is a table that defines the operation of an SSB that is fabricated in accordance with one or more embodiments as a truth table. In accordance with one or more embodiments, an SSB implements a test control path in an LSG/ISG/TSG while the SAB implements a test data path in an LSG/ISG/TSG. In addition, the SCB contains all the control registers that control the different modes of operation of the LSG/ISG/TSG, and the SCB also switches test input data from higher to lower levels of a hierarchy and switches test output data from lower to higher levels of the hierarchy.

In accordance with one or more embodiments an SSB decodes segment address data (SAD) input thereto to generate segment select data output (SELD) which selects an addressed SRAS scan cell in the LSG (or selects an addressed LSG in an ISG) (for example, in accordance with one or more embodiments, the SSB decodes the SAD to produce one "hot-data" word (i.e., only one output has logic value 1 while others have logic value 0 at the SELD outputs). As is shown in FIG. 16, SAD is applied as input to a decoder in a box labeled DECODER, and output from the decoder is applied as input to an OR-tree circuit in a box labeled ORTREE (i.e., a group of logical OR operations) and as input to a multiplexor block labeled MUX. OR-tree circuit ORTREE sets (to 1) all bits of lower order than the active bit in the output of the decoder to select all SRAS scan cells below or above a certain segment address (for example, if a 3 bit SAD address is 101, the decoder outputs 00100000 while the ORTREE circuit produces 00111111). As is further shown in FIG. 16, the compression mode signal (COM) is used as a compression mode signal to select multiple SRAS cells using the output of the ORTREE circuit. To do this, the COM signal is applied as select input to the multiplexor, and output from the multiplexor is applied as input to an inverter in the box labeled INVERT. As is further shown in FIG. 16, an ENA signal is used to disable all the segment select data outputs. To do this, the ENA signal is applied as input to the inverter to disable all SELD output—this effectively disables the SSB. As is further shown in FIG. 16, an invert decode signal (INV) (INV is a mode signal driven by the SCB) is used to optionally invert the output of the multiplexor by, for example, producing one "cold-data" word (i.e., only one signal has value 0 while all others have 1) at SELD outputs. In particular, the INV signal input to the SSB causes the SSB to produce SELD output that (i) selects all but one SRAS scan cell, and (ii) causes test data from all SRAS scan cells to be Exclusive-ORed, excluding the addressee cell.

As one can readily appreciate from FIG. 16, the Decoder block is used to implement a multiplexor and the ORTREE block is used to implement a data compressor corresponding to the Demultiplexor-Decompressor/Multiplexor-Compressor (DDMC) circuit blocks shown in FIG. 8.

Figure 24:
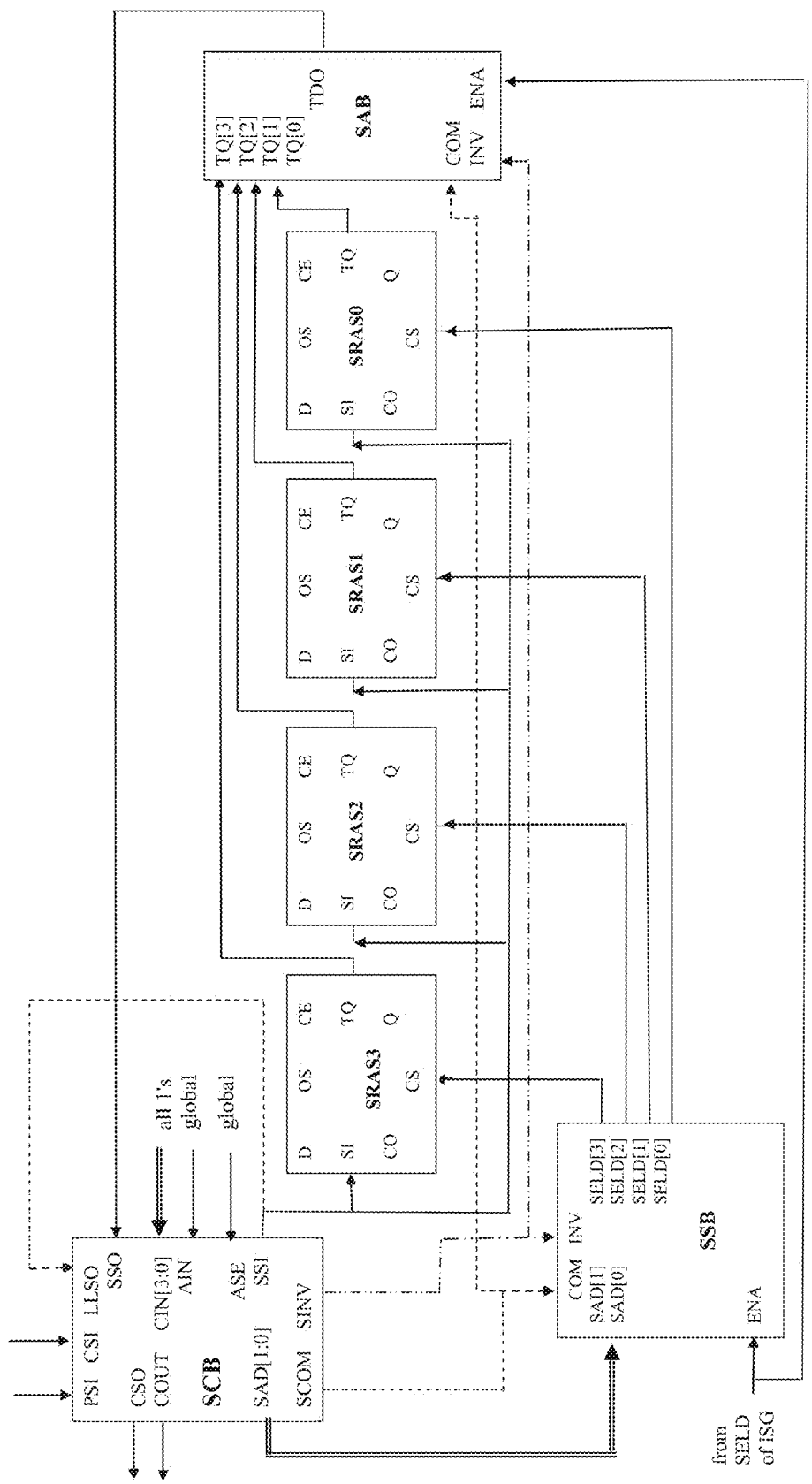
FIG. 24 is a block diagram of a Leaf Scan Group (LSG) with a segment_size of 4 that is fabricated in accordance with one or more embodiments.

In accordance with one or more such embodiments, as shown in FIG. 24, each bit of the SELD output from an LSG SSB is connected to the Cell Select (CS) input pin of an SRAS scan cell within an LSG (i.e., the SELD outputs of an LSG SSB are used to control the CS input pin of all SRAS cells within the LSG). FIG. 18 is a truth table that defines the different values of the following signals: ENA, INV and COM, which signals are associated with the seven (7) modes of operation of the SSB. Row 1 of the truth table shows ENA being de-asserted in the Functional mode and the Test Bypass (TB) mode. Row 2 of the truth table shows only ENA being asserted in the One Address (ON) and the Address Increment (AI) modes. Row 3 of the truth table shows the COM input being asserted in the Less Than or Equal Address (LE) mode. Row 4 of the truth table shows the INV input being asserted in the All Except Address (AE) mode. Row 5 of the truth table shows both the COM input and the INV input being asserted in the Greater Than Address (GT) mode. Note that the One Address (ON) mode and the All Except Address (AE) mode have an inverse relationship. Similarly, the Less Than or Equal Address (LE) mode and the Greater Than Address (GT) mode have an inverse relationship. The SSB design takes advantage of these inverse relationships to reduce area overhead using the INV input pin. The SAD, INV and COM inputs to the SSB are controlled by shift-registers in the Segment Control Block (SCB).

FIG. 19 is a block diagram of a Segment Accumulator Block (SAB) that is fabricated in accordance with one or more embodiments; and FIG. 20 is a table that lists the ports and the port functions of an SAB, and a truth table that defines the Boolean operations of the SAB that is fabricated in accordance with one or more embodiments. The role of the SAB at every level in the hierarchy is to accumulate test output data bits from lower hierarchy levels (SRAS, LSGs or ISGs) into a single bit value, and to feed that single bit value to higher level LSG or ISGs. In accordance with one or more embodiments, as shown in FIG. 19, an SAB performs Reduction-OR and Reduction-XOR operations on its test data input. As further shown in FIG. 19, a compression mode signal (COM) and an invert signal (INV) are applied as input to a logical OR. As further shown in FIG. 19, the output from the Reduction-OR, the Reduction-XOR and the logical-OR are applied as input to multiplexor MUX (the SAB performs either the Reduction-OR operation or the Reduction XOR operation depending on the value of the compression mode input). The output from the Reduction-OR is used to multiplex a single SRAS scan cell to the TDO output pin—this implements the One Address (ON) mode of operation or the Address Increment (AI) mode of operation. This is the result because deselected SRAS scan cells (i.e., cells not being addressed) produce 0 at their TQ pins, which TQ pins provide data inputs to the SAB (as shown in FIG. 19). The Reduction-XOR compresses the output from multiple SRAS scan cells (at their TQ outputs) to a single value at the TDO output pin of the SAB—this implements the Less Than or Equal Address (LE) mode of operation, the Greater Than Address (GT) mode of operation, or the All Except Address (AE) mode of operation. In addition, an enable signal (ENA) is used to disable the output (at the TDO pin) of the SAB to a 0 value to implement the Functional mode of operation or the Test Bypass (TB) mode of operation. As can be seen from FIG. 19, the Reduction-XOR block is used as compressor logic, and the Reduction-OR block is used as the multiplexor corresponding to the Demultiplexor-Decompressor/Multiplexor-Compressor (DDMC) circuit blocks shown in FIG. 8. In accordance with one or more such embodiments, at every level in the hierarchy, the SAB accumulates test output data bits from lower levels of the hierarchy, i.e., SRAS scan cells, LSGs or ISGs, into a single bit value. FIG. 20 is a table that lists the ports and the port functions of an SAB and a truth table that defines the Boolean operations of an SAB that is fabricated in accordance with one or more embodiments. Row 1 of the truth table denotes the Functional mode of operation or the Test Bypass (TB) mode of operation. Row 2 of the truth table denotes the One Address (ON) mode of operation or the Address Increment (AI) mode of operation. Row 3 of the truth table denotes the Less Than or Equal Address (LE) mode of operation. Row 4 of the truth table denotes the All Except Address (AE) mode of operation. Row 5 of the truth table denotes the Greater Than Address (GT) mode of operation.

Figure 21:
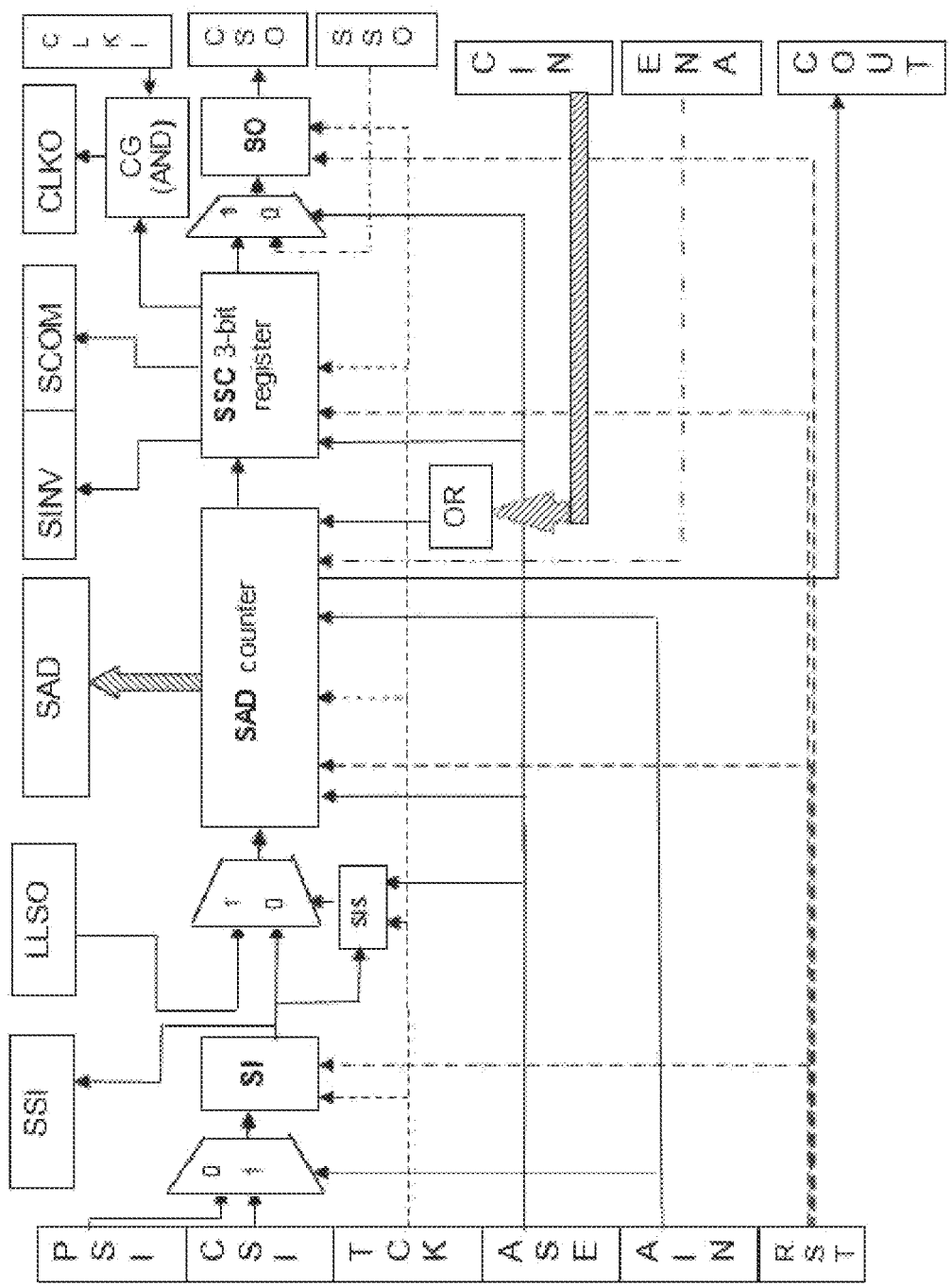
FIG. 21 is a block diagram of a Segment Control Block (SCB) that is fabricated in accordance with one or more embodiments.

FIG. 21 is a block diagram of a Segment Control Block (SCB) that is fabricated in accordance with one or more embodiments (in FIG. 21, all the signals, except those shown as shaded wide arrows, are single bits); and FIG. 22 is a table that lists the ports and the port functions of an SCB that is fabricated in accordance with one or more embodiments. In accordance with one or more embodiments, an SCB is used to: (a) implement the Address Increment (AI) mode of operation by configuring a Segment Address Data (SAD) counter in the SCB to operate as part of a distributed scan address counter; (b) control an SSB and an SAB using shift registers accessible from an SCB in the parent ISG or from chip pins; (c) daisy chain the shift registers of all SCBs in LSGs/ISGs that have a common parent ISG; (d) optionally splice in the daisy chained shift registers of all SCBs in LSGs/ISGs immediately below it in the hierarchy using the unused SI register in the ISG as a control bit to implement the Test Bypass (TB) mode of operation; and (e) turn off functional clocks (labeled as CLKO output port in FIG. 21) in unused LSGs or ISGs (i.e., LSGs or ISGs that are not pulsed in the current test pattern) to reduce power dissipation during a capture procedure using a single bit clock gating signal (SCG) and a clock gating cell (CG)—(the rightmost bit in a 3 bit SSC register is referred to as the SCG, and the SCG controls the CG cell).

The operation of the SCB is described in more detail next. An embodiment of the Address Increment (AI) mode of operation (see above) is described first. In the AI mode of operation, each scan cell is consecutively addressed for loading or unloading using a distributed scan address counter that is comprised of the SAD counters in all SCBs of the DCCT. As shown in FIG. 21, in accordance with one or more embodiments, a carry input signal (CIN) from children LSGs/ISGs immediately below this SCB in the hierarchy is applied as input to an OR circuit (CIN is an address count enable bit vector input—one bit per child). Further, an Address Increment Input (AIN) signal (AIN is a global enable signal for the AI mode of operation), an enable (ENA) signal (ENA is active when the parent ISG selects the LSG/ISG containing the SCB), and output from the OR circuit are applied as input to the Segment Address Data counter in the SCB. In accordance with one or more such embodiments, in response to these inputs, the Segment Address Data (SAD) counter increments the SAD (by 1) and outputs the SAD from a Segment Address Data (SAD) register (the SAD register comprises a part of the SAD counter) to an SAD port when the AIN is high (i.e., is logic 1), and at least one bit of the CIN is high (i.e., is logic 1). The size of the SAD register (i.e., =N bits) is such that "2 to the power N" is equal to the segment_size of the particular embodiment of SRAS DFT technique. The SAD register is connected, through the SAD port, to a bus which is connected, in turn, to an SSB (refer to FIG. 24). In accordance with one or more such embodiments, the SAD counter sets a carry output signal (COUT) (COUT is an address count enable output) high (i.e., is logic 1) when output of the SAD counter reaches the last address value (i.e., the SAD bits are all 1), and the output of the carry OR gate is 1. Note that the first LSG/ISG under each ISG/TSG is enabled (ENA is high) upon reset, since SAD registers reset to 0. When the SAD counter in the first LSG reaches the last count, it generates a COUT pulse and the SCB in its parent ISG increments, disabling the first LSG and enabling the next LSG. This process repeats till the last LSG under the first ISG finishes counting, upon which the SCB in the first ISG generates a COUT pulse to its parent ISG, the SAD counter in the SCB of the second level ISG increments, disabling the first ISG and enabling the next ISG. This process repeats until all the SAD counters in all SCBs in all LSGs finish counting. In accordance with one or more such embodiments, this arrangement enables the construction of a distributed scan address counter by interconnecting SCBs in a hierarchical tree structure corresponding to that illustrated in FIG. 10 and FIG. 26.

An embodiment of SSB and SAB control (see above) is described in more detail next. A single bit compression mode output register (SCOM) and a single bit segment invert data output register (SINV) of the SCB drive the COM and INV ports, respectively, of both the SSB and the SAB (see FIGS. 16 and 19, respectively, and FIG. 24) to implement the shift modes of operation (i.e., ON, GT, LE, AE). As shown in FIG. 21, the SINV and SCOM output ports are driven by the first two (2) bits, respectively, of the 3-bit SSC register. Note, upon activating the global test reset input (RST), the SCOM bit in all SCBs is set to logic 0 and the SINV bit in all SCBs is set at logic 1. This activates the CS input of all scan cells in the DCCT in the functional mode of operation. In the shift modes of operation, the basic sequence for an SCB is as follows. First, an address shift enable (ASE) input signal (ASE is a global enable signal) is asserted and a stream of bits is shifted in through CSI input port of the SCB while the test clock TCK is pulsed in each cycle until the SI register, the SAD register, the SSC register and the SO register are loaded. For example, for an 8-bit SAD register, the ASE input signal is kept active for 1+8+3+1=13 TCK cycles. Next, the functional clock CLK is pulsed to capture the next state into the SRAS cells. Next, the test clock TCK is pulsed to capture the compressed/selected value of all the SRAS cells connected to the SCB via the SAB into the SO register. Next, the ASE input signal is asserted and the test clock TCK is pulsed to stream out the contents of the SI register, the SAD register, the SSC register and the SO register through the CSO output port of the SCB. The last and first steps of consecutive test patterns can be overlapped to minimize test time.

An embodiment of optionally splicing in the daisy chained shift registers of its children SCBs (see above) is described in more detail next. In accordance with one or more such embodiments: (a) the SI register of the SCB captures the channel scan input (CSI) when AIN is logic 1 or the previous segment input (PSI) when AIN is logic 0; (b) the segment input (SI) register of the SCB drives the segment scan input port (SSI) that is connected to the SI input of SRAS scan cells (refer to FIG. 24); (c) the segment output (SO) register of the SCB captures the segment scan output (SSO); (d) the SO register drives the channel scan output port (CSO); (e) the SI register has a shadow register (SIS) that captures the SI register state when an address shift enable (ASE) input signal is low (i.e., is logic 0)—therefore, the SIS register contains the value of the SI register from the previous shift operation which needed the ASE signal to be high (i.e., logic 1); and (f) the SI register, the SAD register, the SSC register (which contains the SINV, SCOM and SCG bits, refer to FIG. 21) and the SO register form a shift register when the ASE signal is high (i.e., is logic 1). With respect to previous section (f), note that the daisy chained shift registers associated with the next lower (hierarchy) level SCBs would be included between the SI register and the SAD register in the shift path, via a last leaf scan out (LLSO) input, if the SIS register were high (i.e., logic 1).

In accordance with one or more such embodiments: (a) all registers in the SCB are reset to 0 by a test reset input (RST) (i.e., a global control to reset test circuitry), and are clocked by a test clock input (TCK) (i.e., a clock for test circuitry).

FIG. 23 is a table that lists the top level test pins and their functions in test circuitry in accordance with one or more embodiments. The following signals are optional global signals that are connected to all SRAS scan cells: observe enable (OE); control override (CO); observe override (OO); and output select (OS). The following signals are input to all SCB instances: test reset global clock (RST); test clock (TCK); Address Shift Enable (ASE) signal; and Address Increment (AIN) signal. The SRAS DFT technique supports multiple global scan channels. Each global scan channel has its own dedicated CSI, CSO, ASE and AIN ports. All other control signals (i.e., OE, CO, OO, OS and RST) can be shared among all scan channels. Alternately, CSI and CSO scalar ports can be replaced by vector (i.e., multi-bit signals) ports to access SRAS cells in a word-parallel fashion. This can reduce the separate number of SSB, SAB and SCB blocks required for a particular DCCT design.

A Leaf Scan Group (LSG) is a fundamental building block of an embodiment of the SRAS DFT technique. FIG. 24 is a block diagram of an LSG with a segment_size of four (4) that is fabricated in accordance with one or more embodiments. In accordance with one or more embodiments, an SSB, an SAB, an SCB and a segment_size number of SRAS cells are combined to form the LSG. In accordance with one or more embodiments, the SCB generates a segment address signal (SAD) and compression mode signals (SCOM, SINV) for the SRAS scan cells in the LSG, and applies these signals as input to the SSB and SAB. Then, in accordance with one or more such embodiments, using the SAD, the SSB activates one or more SRAS scan cells using CS enabling pins therein. In order to select one (1) out of four (4) SRAS scan cells (i.e., when segment_size is 4) in accordance with one or more embodiments, the SSB receives a 2-bit wide segment address signal (SAD) from the SCB. In accordance with one or more embodiments, the selected SRAS scan cells receive scan in data applied as input to its SI (scan in, i.e., test data in) pin from the SCB and store it, and the SAB selects the scan out data from the TQ pin of the SRAS scan cell to be sent out via the 1-bit TDO output pin of the SAB. Depending on the compression mode signal (COM) and the invert mode signal (INV) that the SAB receives from the SCB, the SAB outputs the scan data via its TDO pin, to be passed on to an ISG at the next higher level of the hierarchy. As shown in FIG. 24, both the SSB and the SAB receive the invert (INV), compression mode (COM), and enable (ENA) signals. In accordance with one or more embodiments, the ENA signal for an LSG always comes from a parent ISG node above that LSG in the hierarchy (the parent ISG outputs one (1) bit for each child LSG); and as shown in FIG. 24, the Last Leaf Scan Out (LLSO) input pin of an SCB inside an LSG is always connected to the SSI. This is because the SCB in an LSG is at the lowest level in the hierarchy.

In the Address Increment (AI) mode of operation, an SCB in an ISG or an LSG, respectively, receives scan in data from higher hierarchical level ISGs via its CSI input port, and the SCB broadcasts it to lower hierarchical level ISGs or LSGs or SRAS scan cells using its SSI output port (refer to FIG. 21). In the Address Increment (AI) mode of operation (AIN=1), the address counter (i.e., the SAD counter in FIG. 21) in the SCB is incremented every (TCK) clock cycle when at least one of the CIN bits is 1 and ENA is 1 to select the scan output (SSO) port from a lower hierarchical level to propagate to the scan channel of a higher hierarchical level via the CSO output port of that SCB (see FIG. 21). In the shift modes of operation (i.e., the ON, LE, GT, or AE modes)) (ASE=1), all the registers in the SCB collectively form a single shift register, and all LSGs at the same SRAS DFT technique hierarchical level are daisy chained together using the PSI input port of the SCB (i.e., a data input port to an LSG, see FIG. 24) and the CSO port of the SCB (i.e., the data output port from the LSG, see FIG. 24). In accordance with one or more embodiments, this arrangement can be used to load a unique SAD setting and compression mode setting into the SCB of each LSG block, thereby propagating the compressed state value of SRAS scan cells directly controlled by the SCB using the SSO input port and the CSO output port of the SCB (see FIG. 21).

Figure 25:
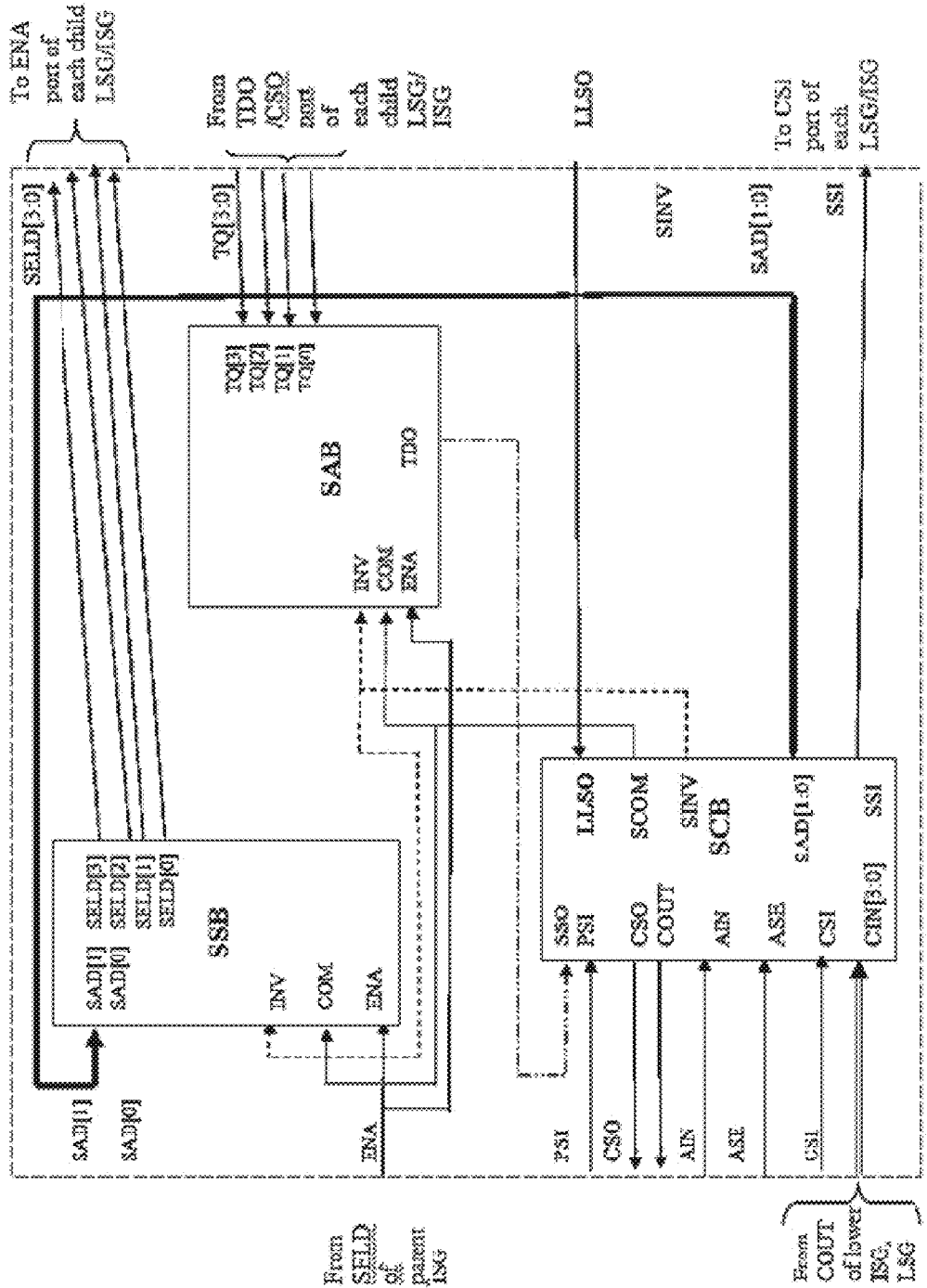
FIG. 25 is a block diagram of an Intermediate Scan Group (ISG) with a segment_size of 4 that is fabricated in accordance with one or more embodiments.

In accordance with one or more embodiments, a segment_size number of LSGs, a single SSB, a single SAB, and a single SCB are combined to form an Intermediate Scan Group (ISG). FIG. 25 is a block diagram of an Intermediate Scan Group (ISG) that is fabricated in accordance with one or more embodiments for the same 4×4 segment for which the LSG was shown in FIG. 24. The segment_size is fixed at 4 in both dimensions (i.e. at both the LSG and the ISG hierarchical levels). As shown in FIG. 25, the four LSG child nodes under a single ISG will be sending LSG scan test data (via their TDO output pins) into the four TQ input pins of the SAB in that ISG. As further shown in FIG. 25, incoming TQ data bits are either compressed as a group or selected one bit at a time within the SAB, based on the INV and COM mode control signals; and that result (of TQs) is then sent out via the TDO pin of the SAB in the ISG into the SSO input pin of the SCB in the same ISG. In accordance with one or more such embodiments, all child LSGs belonging to a single ISG are always daisy chained together using the previous segment input (PSI) pin and the channel scan output (CSO) pin of the SCB (i.e., in FIG. 25, the CSO port sends data to the PSI port of the LSG immediately to the "right of it" in the sense of FIG. 10). In accordance with one or more such embodiments, this enables: (a) the scan input (SI); (b) the segment address (SAD); (c) the segment compression mode (SCOM); (d) the segment invert mode (SINV); (e) the clock gating cell control (SCG); and (f) the scan output (SO) registers of the SCB at each LSG to be shifted in, and the selected or compressed SRAS scan cell data output of each LSG to be shifted out. Further, the CSO pin of the last LSG of that daisy chain of LSGs is connected to the LLSO input of the SCB in the parent ISG. In accordance with one or more such embodiments, this enables the bypassing of all LSGs belonging to that ISG in order to reduce the time taken to load the segment address (SAD) and compression mode signals for other ISGs at the same level of the hierarchy. If none of the LSGs under an ISG are used in the current test, those LSGs can be bypassed (from the shift path) by setting the SIS shadow register (to 1) in the SCB (of this ISG) to reduce test application time (TAT). In accordance with one or more such embodiments, the carry output pin (COUT) of all LSGs under an ISG is connected to the carry input pins (CIN) of that ISG (i.e., the parent to the LSGs). This connection is used to operate all the SCBs that fall hierarchically under an ISG as a distributed address counter (i.e., logically assembling an individual SAD counter in each SCB to act as a very wide single counter) by keeping the Address Increment (AIN) mode signal active (i.e., equal to logic 1).

In accordance with one or more embodiments of the SRAS DFT technique, an ISG has three categories of modes of operation: an Address Increment (AI) mode of operation, a Test Bypass mode of operation (TB), and shift modes of operation (i.e., the ON, LE, GT, and AE modes). In accordance with one or more embodiments, in the AI mode of operation (AIN=1), the SCB (name it S1) in an ISG (name it G1) broadcasts scan data coming to its CSI input port (the same CSI signal in S1 and G1) from a higher hierarchical level to its SSI output port (same SSI in S1 and G1), which SSI output port then feeds all CSI input ports of the child (i.e. lower hierarchy level) LSGs of that ISG (i.e., G1). In accordance with one or more embodiments, the SCB (S1) also increments its SAD address counter when any of the bits in the CIN input signal of S1 goes high (i.e., becomes logic 1) and AIN is high in order to sequentially select the SSO input pin from each child LSG to its CSO output (same CSO signal in S1 and G1). In accordance with one or more embodiments, in the TB mode of operation (SIS bit=0), all LSGs under an ISG (name it G2) are removed from the control shift path. When bypassed, the control shift path (in G2) through the SCB (in G2) contains the CSI port, the SI register, the SAD register, the SSC register, the SO register, and the CSO port (see FIG. 21). In accordance with one or more embodiments, in the shift modes of operation (SIS bit=1), the daisy chained SCBs in LSGs under the ISG (name it G3) are inserted into the control shift path. In these shift modes, the control shift path (in G3) through the SCB (in G3, name it S3) contains the CSI port, the SI register, and the SSI port, then to the scan path in child LSGs, (back again to S3) the LLSO input port (of G3 and S3), the SAD register (of S3), the SSC register (of S3), the SO register (of S3), and the CSO port (same signal in S3 and G3).

Figure 26:
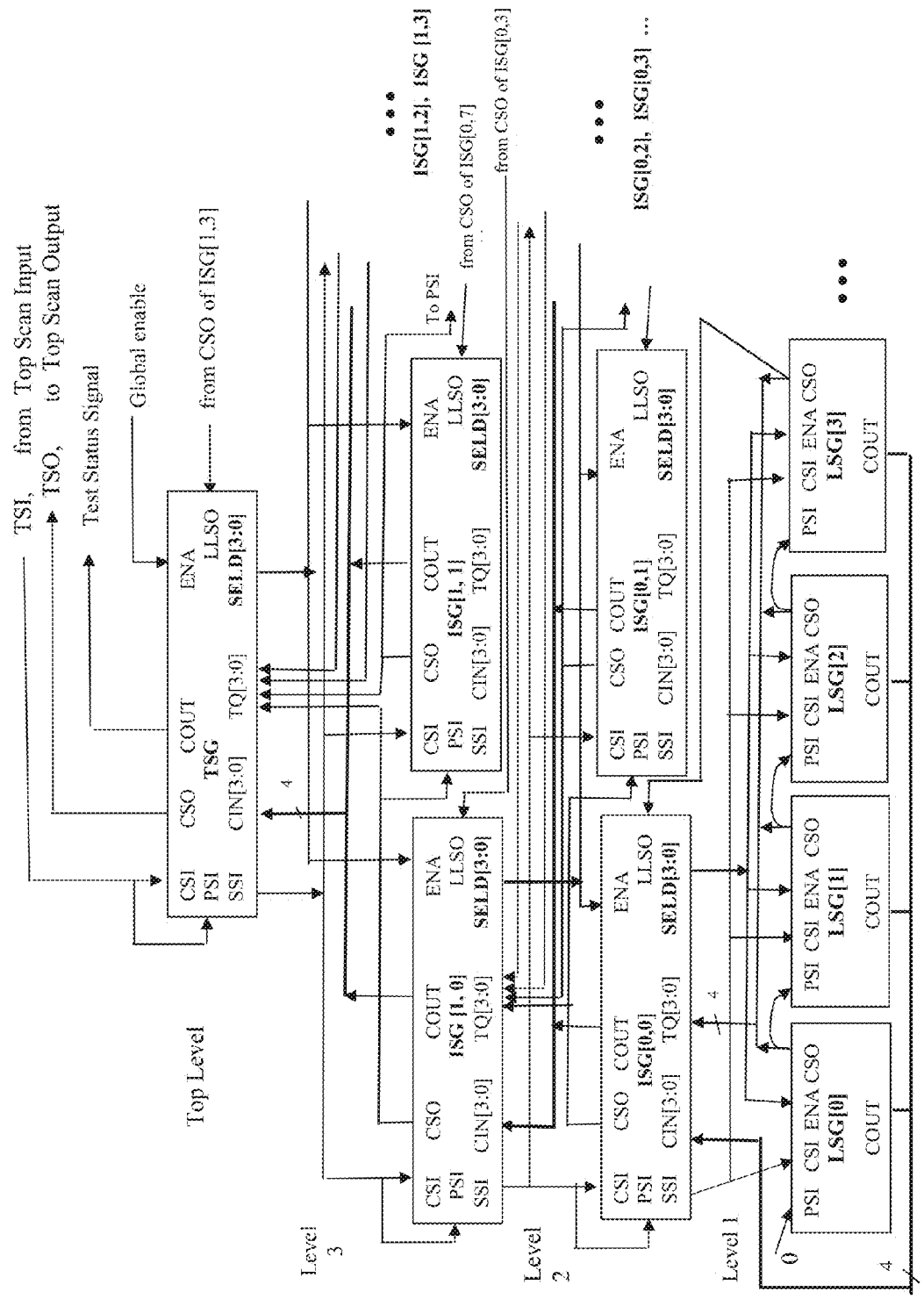
FIG. 26 is a block diagram that shows the hierarchical interconnection of Intermediate Scan Groups (ISGs) and Leaf Scan Groups (LSGs).

In accordance with one or more embodiments, an SSB, an SAB, an SCB and a number (equal to the segment_size) of first level ISGs at the same level of the hierarchy are combined to form a second level ISG block. FIG. 26 is a block diagram that shows the hierarchical interconnection of ISGs and LSGs for the same 4×4 segment SRAS circuitry for which the LSG was shown in FIG. 24, and for which the ISG was shown in FIG. 25. Note that ISGs are labeled ISG[x,y], where x is the hierarchical level above the level of the LSGs (i.e., x=0 for the first hierarchical level above the level of the LSGs, x=1 for the second hierarchical level above the level of the LSGs, and so forth), and y is an ISG index at a particular hierarchical level. The four (4) child LSGs under each ISG are labeled LSG[0] through LSG[3]. As shown in FIG. 26, ISGs in the first level of ISGs (i.e., ISGs at hierarchy level 2 in FIG. 26) are connected to ISGs in the second level of ISGs in a manner similar to the way LSGs are connected to ISGs in the first level of ISGs. In accordance with one or more embodiments, if none of the ISGs in a first level of ISGs under an ISG at a second (and higher hierarchical) level of ISGs are used in a particular test pattern, they can be bypassed using the SIS register in the SCB (of a higher level ISG) to reduce TAT by reducing the length of the shift path. An Automatic Test Pattern Generation (ATPG) tool can choose a segment address and compression mode for each SCB in the SRAS circuitry for each test pattern to minimize TAT. Note that some of the global signals like AIN, ASE, RST, CO, OO, TCK and OE are not shown in FIG. 26 in the interest of clarity.

In accordance with one or more embodiments, a second level ISG has three categories of modes of operation: an Address Increment (AI) mode of operation, a single-ISG mode of operation (wherein all except one first level ISG are in the Test Bypass mode), and a multiple-ISG mode of operation (wherein several first level ISGs are not in the Test Bypass mode). In accordance with one or more embodiments, in the Address Increment (AI) mode of operation, all SRAS scan cells under the second level ISG are consecutively addressed. For example, with reference to FIG. 10, in the AI mode of operation, SRAS scan cell 0 to SRAS scan cell 63 are addressed consecutively since the TSG is actually a second level ISG in FIG. 10. In the single-ISG mode of operation, only one of the first level ISGs is selected. For example, with reference to FIG. 10, if LSGs under ISG1 are selected, the shift path contains TSG, ISG0, LSG4, LSG5, LSG6, LSG7, ISG1, ISG2, ISG3, and back to TSG. Note that the SCB shown in FIG. 21 implements a pre-mux such that the lower level SCB registers are included before the SCB registers at the current level, leading to the above order. An SCB that implements a post-mux such that the lower level SCB registers are included after the SCB registers at the current level is an alternative embodiment. In accordance with one or more embodiments, each selected LSG: (a) decompresses or demultiplexes (i.e., distributes) the scan input to all SRAS scan cells under it; and also (b) compresses or multiplexes the scan outputs of all SRAS scan cells under it.

In accordance with one or more embodiments of the SRAS DFT technique, two or more first level ISGs can be selected by the SCB in the second level ISG. For example, with reference to FIG. 10, if LSGs under ISG1 and ISG3 are both selected, a control shift path consists of TSG, ISG0, LSG4, LSG5, LSG6, LSG7, ISG1, ISG2, LSG12, LSG13, LSG14, LSG15, ISG3, and back to TSG to reduce test application time (TAT) by not selecting ISGs and LSGs which are not relevant for a particular test pattern.

In accordance with one or more embodiments, second level ISGs can be interconnected in a similar way to that shown for the first level ISGs in FIG. 10 to form third level ISGs and so on up the hierarchical levels of the DCCT until up to the top module. The top level ISG is also referred to as the Top Scan Group (TSG). At any hierarchical level, if none of the lower level ISGs is used in a current test pattern, they can be bypassed using the SIS register in the SCB of the appropriate ISG to reduce TAT.

In the functional mode of operation, the values of all SRAS scan cells can optionally be accumulated using the XOR gate network inside an SAB shown in FIG. 19 and observed at the scan output port of the SCB that is hierarchically connected to the scan output port of the TSG, as shown in FIG. 26. The scan output port of the TSG can then be monitored during functional operation for IC chip debug purposes. In the functional mode of operation, the optional Control Override (CE) signal can be used to force all SRAS scan cells to the value specified in the scan input (SI). This allows the initialization of all scan cells to either 0 or 1 in one clock cycle. Some faults in combinational circuits are undetectable if all the sequential elements in which their fault effect can be captured are endpoints of race paths. The optional Output Select (OS) port can be used to bypass the flip-flop inside the SRAS cell and capture the fault effect directly into the SCB in the shift modes of operation to avoid test coverage loss due to race paths targeting the flip-flop. The optional Observe Enable (OE) port can be used to force the test outputs of the SRAS scan cell to logic zero during functional operation to prevent the changing values of SRAS scan cells from reaching the SSB and SCB. When a portion of a DCCT does not change its values, it dissipates less dynamic power without affecting its functionality. Thus the power overhead of the SRAS DFT technique (i.e., the power dissipation in the SSB, the SAB and the SCB during functional operation of the DCCT) is optionally minimized at the cost of the additional area overhead of the embodiment of the SRAS scan cell with observe enable port as shown in FIG. 13.

In accordance with one or more embodiments, in the functional mode of operation, the global test reset input (RST) is kept active and the global test clock input (TCK), the global Address Shift Enable input (ASE), and the global Address Increment input (AIN) are held inactive (see FIG. 23). Upon activating RST, the SCOM bit in all SCBs are set to logic 0 and the SINV bit in all SCBs are set to logic 1. This activates the CS input of all scan cells in the DCCT in the functional mode of operation.

The Address Increment (AI) mode of operation is entered by deactivating the global test reset input RST, and activating the global control signal AIN. Scan input data is shifted into the TSI input, and scan output data is shifted out of the TSI output when the global control signal ASE is high and the TCK input is pulsed. The duration of each shift operation depends on the total number of scan cells in the DCCT.

The Test Bypass (TB) mode of operation is entered by de-activating the global control signal AIN and pulsing the global test reset input RST. Since the SI and SIS registers in all SCBs reset to 0, only the SCB in the TSG appears between TSI and TSO initially.

The shift modes of operation involve sequentially applying control data to the TSI chip input pin and sequentially observing status data from TSO chip output pin, using the ASE chip input pin as a shift enable for concatenated SCB shift registers of varying length. Upon reset only the SCB in the TSG appears in the scan path between TSI and TSO upon activating ASE (SI registers reset to 0). The shift modes of operation are entered by shifting 1 into the SI register of the top level SCB, the SCBs in ISG[1,0], ISG[1,1], ISG[1,2] and ISG[1,3] in FIG. 26 are spliced into the scan path between TSI and TSO by activating ASE. If the portion of the DCCT controlled by ISG[0,0] is targeted by ATPG software, the SI register of ISG[1,0] is set to 1 (while keeping the SI bits of ISG[1,1], ISG[1,2] and ISG[1,3] at 0) using another shift operation to splice in the SCBs corresponding to ISG[0,0], ISG[0,1], ISG[0,2] and ISG[0,3] into the scan path. Finally, the SI register of ISG[0,0] is set to 1 (while keeping the SI bits of ISG[0,1], ISG[0,2] and ISG[0,3] to 0) to splice the SCBs corresponding to LSG[0], LSG[1], LSG[2] and LSG [3] into the scan path. We are now in one of the four (4) shift modes of operation. Now, an address (SAD), mode bits (i.e., SINV, SCOM and SCG), and SI can be loaded into LSG [0]-LSG[3] to load bit patterns into SRAS scan cells in them. The SINV and SCOM bits loaded into each SCB in LSG [0]-LSG[3] determine its mode of operation (see FIG. 20). After pulsing capture clocks to capture the next state of the SRAS cells, the test clock TCK is pulsed to capture the state of SRAS scan cells in LSG[0]-LSG[3] in a compressed or selected form into the SO register of the corresponding SCB. Finally, the state of the SO register in all the SCBs in LSG[0]-LSG[3] is shifted out of the TSO global output pin (unload). This can be overlapped with the loading of the next compressed pattern into the SCBs in LSG[0]-LSG[3].

Operation:

Automatic Test Pattern Generation (ATPG) tool software is used to automatically generate comprehensive tests for a DCCT that is configured for testing in accordance with a scan DFT technique. Each ATPG tool logical test pattern specifies a set of SRAS scan cells to be controlled to either 0 or 1 value, and a set of SRAS scan cells to be observed after pulsing the system clock. The ATPG tool software needs to be enhanced to support the CRAS-N or the SRAS DFT technique. The following describes embodiments of ATPG tool software algorithms for use in testing DCCTs that are configured for testing in accordance with the CRAS-N DFT technique or the SRAS DFT technique.

ATPG software algorithms can be classified into three broad classes: (a) Test Generation algorithms that systematically generate stimuli/responses against a model of all possible failure mechanisms of the DCCT; (b) Test Compression algorithms that use compression/decompression circuitry available in a DFT technique to minimize test pattern size; and (c) Test Application algorithms that combine a compressed test pattern of different hierarchical blocks with DCCT-specific clocking to minimize TAT. Standard Test Generation Algorithms can be used with DCCTs that are configured for testing in accordance with the CRAS-N DFT technique or the SRAS DFT technique, however Test Compression and Test Application algorithms suited, and perhaps optimized, for DCCTs that are configured for testing in accordance with the CRAS-N DFT technique or the SRAS DFT technique are required. This is described in more detail next.

Test patterns generated by ATPG tool software comprise four major operational procedures. These operational procedures are: (a) a load procedure; (b) an unload procedure; (c) a load-unload procedure; and (d) a capture procedure. The load procedure is used to control (set) any scan cell in the DCCT to a desired logic value, i.e., either 0 or 1; the unload procedure is used to observe (read and compare) any scan cell in the DCCT at an output pin; the load-unload procedure is used to simultaneously control and observe any scan cell in the DCCT; and the capture procedure is used to capture (by applying clocks) the next state of the DCCT into scan cells. Typically, the capture procedure involves pulsing one or more clocks in a DCCT as specified by the Test Generation algorithm. Typically the unload procedure for the previous test pattern is merged with the load procedure of the current test pattern to reduce TAT. The first ATPG tool test pattern consists of the load procedure followed by the capture procedure. The last ATPG tool test pattern consists of a load-unload procedure, followed by the capture procedure, followed by the unload procedure. All other ATPG tool test patterns consist of the load-unload procedure followed by the capture procedure.

Each ATPG tool test pattern (i.e., the ATPG tool test pattern for all scan cells in a DCCT) is comprised of: (a) a Control vector C; (b) an Observe vector O; and (c) a State vector S. The Control Vector C includes the loaded values of all scan cells in the DCCT; the Observe Vector O includes the unloaded values of all scan cells in the DCCT at which a fault effect is observable; and the State vector S includes the set of scan cell values just after the capture procedure has been applied to the DCCT in the test pattern. The Observe vector O is a small subset of the State vector S since only a few state elements (i.e., scan cells) will detect previously undetected faults (i.e., faults not already detected in prior test patterns). ATPG tools that support scan test compression take advantage of this property to reduce TAT by only observing the much smaller Observe vector compared to the State vector. Algorithms to generate the Control vector C, the Observe vector O and the State vector S for a set of possible faults are called Test Generation algorithms. No special Test Generation algorithms are needed for the CRAS-N DFT or the SRAS DFT techniques since they only depend on most, if not all, storage elements in the DCCT having a back-door control and observe mechanism.

Algorithms to optimally utilize the DFT architecture of a chip provided in accordance with a DFT technique to minimize TAT are called Test Application algorithms. Special Test Application algorithms are required for DCCTs that are configured for testing in accordance with the CRAS-N DFT technique or the SRAS DFT technique since the CRAS-N and the SRAS DFT techniques produce a unique DFT architecture. For example, an ATPG tool must operate the circuitry provided in accordance with the SRAS DFT technique to load all scan cells (i.e., SRAS scan cells) that need to be controlled, and to unload all scan cells that need to be observed for each test pattern to reduce TDV and TAT. To do this for the SRAS DFT technique, the ATPG tool chooses a segment address and an operating mode for each SCB in the circuitry provided in accordance with the SRAS DFT technique for each test pattern that minimizes TAT and TDV using algorithms presented below. In general, a sequence of segment addresses and operating modes is needed for each SCB to control and observe all relevant scan cells in a test pattern. Also, only LSGs containing scan cells that need to be controlled or observed in a current test pattern should be added to a control shift path to minimize load-unload time. Heuristic algorithms to optimally operate the circuitry provided in accordance with the SRAS DFT technique to minimize TAT and TDV are described below.

All test compression schemes are challenged by the presence of unknown values (X) in the DCCT. Unknown values are produced by embedded memories, analog macros and non-scan flip-flops in the DCCT. An unknown value makes it difficult for ATPG tool software to accurately compute the expected state and faulty state of the DCCT. Special test circuitry is added to the DCCT to mitigate the effect of this problem. Algorithms to effectively utilize this test circuitry are called Test Compression algorithms. Test Compression algorithms that are optimized for the CRAS-N or the SRAS DFT techniques are described in detail below.

Table 1 below shows a high level Test Application algorithm adapted to an architecture provided by a 256×256×256 SRAS DFT technique.

Table 2 below shows a detailed Test Application algorithm for the architecture provided by the 256×256×256 SRAS DFT technique.

Table 3 below shows a high level Test Application algorithm for an ISG.

Table 4 below shows a detailed Test Application algorithm for an ISG in the architecture provided by the 256×256×256 SRAS DFT technique.

Table 5 below shows a high level Test Compression algorithm for a low level ISG.

Table 6 below shows a Test compression algorithm for a low level ISG in the presence of conflicts.

Table 7 below shows a detailed test compression algorithm for a low level ISG in the presence of conflicts.

Table 8 below shows the execution trace of the Test Compression algorithm.

Detailed Operation

Embodiments of ATPG tool algorithms for the SRAS DFT technique are illustrated using a DCCT having 256× 256×256 SRAS scan cells. In accordance with this embodiment, each SCB will have a shift path of 13 registers (SI+8 bits for SAD+SINV+SCOM+CG+SO) to shift in control signal values. See FIG. 20 for details of an SCB. The embodiment of the circuit provided in accordance with the SRAS DFT technique of this example consists of: (a) one TSG; (b) 256 first level ISGs; (c) 256 LSGs for each first level ISG; and (d) 256 SRAS scan cells for each LSG—giving a total of 16,777,216 SRAS scan cells organized in a manner similar to that shown in FIG. 10.

Pseudo code of a Test Application algorithm optimized for the SRAS DFT technique is shown in Table 1. At each step, generated test patterns are fault simulated and detected faults are dropped from the fault list. The sequence aborts when the undetected fault list becomes empty. Note that as many faults as possible are detected using just one ISG to minimize TAT. In general, TAT is minimized by reducing the number of ISGs used to detect a particular fault. Therefore, faults are detected using one ISG, followed by faults that need pairs of ISGs, followed by faults that need quadruplets of ISGs, followed by fault that need octuplets of ISGs, and so on. This is done to minimize the length of the control shift path at each step. Note that ATPG tool test pattern generation is performed hierarchically, even though the generated test patterns operate at the top level (i.e. at the chip level).

TABLE 1

Test Application algorithm adapted to a 256 × 256 × 256 SRAS architecture

| | |
|---|---|
| 1 | Use pseudo-random stimulus with address-increment mode to detect easy faults |
| 2 | Detect all possible faults in one ISG at a time |
| 3 | Detect all possible faults in consecutively addressed pairs of ISGs at a time |
| 4 | Detect all possible faults in consecutively addressed quadruplets of ISGs at a time |
| 5 | Detect all possible faults in consecutively addressed octuplets of ISGs at a time |
| 6 | Detect all possible faults in consecutively addressed 16 ISGs at a time |
| 7 | Detect all possible faults in consecutively addressed 32 ISGs at a time |
| 8 | Detect all possible faults in consecutively addressed 64 of ISGs at a time |
| 9 | Detect all possible faults in consecutively addressed 128 ISGs at a time |
| 10 | Detect all possible faults in consecutively addressed 256 ISGs at a time |

Test generation time and TAT is minimized when the above sequence completes as early as possible. ISGs that have logical dependencies (i.e., where fault effects in one ISG are observed in another ISG) should be consecutively addressed for the above sequence to finish in the shortest time. The Test Application algorithm corresponding to Table 1 above is described in Table 2 below. Steps 4 to 7 in Table 2 below correspond to step 1 in Table 1 above. Steps 10 and 11 in Table 2 below correspond to step 2 in Table 1 above. Steps 2 to 19 in Table 2 below correspond to steps 3 to 10 in Table 1 above.

TABLE 2

Detailed Test Application algorithm for a 256 × 256 × 256 SRAS architecture

1. Pulse RST
2. Set AIN to 1
3. Assert (set to 1) global Observe Enable OE and Output Select OS if necessary
4. Apply pseudo-random values at TSI at the top level (TSG) for 16,777,216 cycles; in each cycle pulse TCK four times (3 clocks for CSI to SSI port via SI register in three hierarchy levels of SCB + SRAS scan cell)
5. Pulse CLK once to capture data via functional ports into SRAS scan cells
6. Apply pseudo-random values on TSI, and observe on TSO the circuit response to the previously applied test stimulus for 16,777,216 cycles; in each cycle, pulse TCK four times as in step 4 above
7. Fault simulate test stimuli to mark the detected faults off
8. Repeat steps 5, 6, and 7 till the number of newly detected faults in step 7 drops below a particular threshold such as, but not limited to, 1%, or 10%
9. Assert (=1) global Observe Enable OE
10. Partition and distribute the undetected fault list of the entire DCCT into ISGs at the first hierarchy level in such a way that all SRAS scan cells in the input logic cone (so the fault can be made active) of each fault and at least one SRAS scan cell in the output logic cone (so the fault effect can be captured in the SRAS scan cell) of the same fault are contained within a single ISG
11. For each lowest hierarchy level ISG
    a. Pulse RST
    b. Load the SCB of the top level ISG with test data at its CSI so that its SI register is set to 1, by asserting ASE for 13 cycles (for propagation through SCB)
    c. Load the SCB of the ISG under test with test data so that its SI register is set to 1, and register bits of SCBs in all other ISGs are set to 0, by asserting ASE for 3341 (=13 + 256*13) TCK cycles
    d. For each fault F assigned to the current ISG
        i. Generate an ATPG test pattern that controls and observes necessary SRAS scan cells under the current ISG (i.e. in child LSG nodes) to detect the fault F
        ii. Simulate the test pattern against all undetected faults and mark as detected
        iii. Compress the test pattern to minimize test time while eliminating conflicts
        iv. Load the SI, SAD, SINV, SCOM, CG, and SO values of SCB in each LSG under the current ISG with the values specified by the current ATPG test pattern, while unloading the SO value from the previous ATPG test pattern, by asserting ASE for 6669 (=13 + 256*13 + 256*13) TCK cycles
        v. Pulse CLK to capture fault effect data into SRAS cells
        vi. Pulse TCK to capture fault effect data into SO register in SCB of LSG
12. Repeat 10 and 11 for consecutively addressed pairs of lowest level ISGs and hence d.iv requires 9,997 (=13 + 256*13 + 2*256*13) TCK cycles
13. Repeat 10 and 11 for consecutively addressed quadruplets of lowest level ISGs and hence d.iv requires 16,653 (=13 + 256*13 + 4*256*13) TCK cycles
14. Repeat 10 and 11 for consecutively addressed octuplets of lowest level ISGs and hence d.iv requires 29,965 (=13 + 256*13 + 8*256*13) TCK cycles
15. Repeat 10 and 11 for consecutively addressed groups of 16 lowest level ISGs and hence d.iv requires 56,589 (=13 + 256*13 + 16*256*13) TCK cycles
16. Repeat 10 and 11 for consecutively addressed groups of 32 lowest level ISGs and hence d.iv requires 109,837 (=13 + 256*13 + 32*256*13) TCK cycles
17. Repeat 10 and 11 for consecutively addressed groups of 64 lowest level ISGs and hence d.iv requires 216,333 (=13 + 256*13 + 64*256*13) TCK cycles
18. Repeat 10 and 11 for consecutively addressed groups of 128 lowest level ISGs and hence d.iv requires 429,325 (=13 + 256*13 + 128*256*13) TCK cycles
19. Repeat 10 and 11 for consecutively addressed groups of 256 lowest level ISGs and hence d.iv requires 855,309 (=13 + 256*13 + 256*256*13) TCK cycles The Test Application Algorithm for a single ISG (11.d in Table 2) is described in more detail next. It is also assumed that each ATPG tool test pattern specifies a set of SRAS scan cells to be controlled to either a 0 or 1 value, and that a set of SRAS scan cells is to be observed after pulsing the DCCT clock (=CLK). Usually, to reduce TAT, control values for a current ATPG test pattern are loaded concurrently with unloading of values to be observed from a previous ATPG test pattern. Further, in a system designed in accordance with the SRAS DFT technique, most faults are detected by testing one ISG branch at a time (for example, such as ISG1 branch containing LSG4 through LSG7 in FIG. 10). The Test Application algorithm for a low level ISG is provided in Table 3 below. Note that steps 1, 2 and 3 in Table 3 correspond to a test setup procedure, while steps 3, 4 and 5 correspond to a test pattern.

TABLE 3

Test Application algorithm for an ISG

1. Load the SCB registers in the TSG to enable to select the sub-tree containing the (lower level) ISG under test, let it be the ISG[1, 0]
2. Load the SCB registers in ISG[1, 0] to select the ISG under test, let it be ISG[0, 0]
3. Load the SCB registers of all LSGs under the lowest level ISG (in this case ISG[0, 0])

TABLE 3-continued

Test Application algorithm for an ISG

| | |
|---|---|
| | under test with stimulus values, let them be LSG[0 . . . 255] |
| 4 | Pulse capture clock, CLK |
| 5 | Via the TSG, unload the SCB registers of all LSGs under the ISG under test with the captured values while loading the TSG scan in pin with the stimulus values of the next test pattern |
| 6 | Repeat steps 3, 4, and 5 until all possible faults in the DCCT are detected |

The sequence of operations required to apply ATPG test patterns to a single ISG (i.e. the ISG under test) is described in more detail next in Table 4. Steps 2 to 4 in Table 4 below correspond to steps 1 to 3 in Table 3 above. Step 7 in Table 4 below corresponds to step 5 in Table 3 above. Step 9 in Table 4 below corresponds to the unload procedure associated with the last test pattern.

TABLE 4

Test Application algorithm for an ISG in a 256 × 256 × 256 SRAS circuit

| | |
|---|---|
| 1 | Pulse RST |
| 2 | Load the SCB registers of the TSG with data so that SI and CG register bits become 1, by asserting ASE for 13 (shift through SCB) TCK clock cycles |
| 3 | Load the SCB registers of the ISG under test with data so that the SI and CG register bits become 1, and register bits of the SCBs in all other ISGs become 0, by asserting ASE for 3341 (=13 + 256*13) TCK clock cycles |
| 4 | Load the SAD, SI, CG, SCOM and SINV register values of all 256 LSGs under the ISG which is under test with the values specified by the ATPG test pattern, by asserting ASE for 6669 (=13 + 256*13 + 256*13) TCK clock cycles |
| 5 | Pulse CLK once to capture test data into an SRAS cell or cells |
| 6 | Pulse TCK once to capture data into the SO register bit in the SCB |
| 7 | Load the SAD, SI, SCOM, CG and SINV register values of all 256 LSGs under the ISG that is under test with the values specified by the next ATPG test pattern, while unloading the SO value from the previous ATPG test pattern, by asserting ASE for 6669 (=13 + 256*13 + 256*13) TCK clock cycles |
| 8 | Repeat steps 5, 6 and 7 till all faults in the ISG under test are detected by ATPG |
| 9 | Load the SAD, SCOM and SINV register values for all LSGs under the ISG which is under test while unloading the SO value from the last ATPG test pattern, by asserting ASE for 6669 (=13 + 256*13 + 256*13) TCK clock cycles |

The longest shift path in this is 6669 as shown in row 9 of Table 4. The maximum test data compression ratio achievable in this embodiment is 2515 (i.e., 16,777,216/6669). This assumes that the initialization time associated with steps 1 through 4 can be amortized over several ATPG test patterns. Note that steps 5 through 7 may have to be repeated multiple times to control and observe all relevant SRAS scan cells specified in the ATPG test pattern. Also, pairs or quadruplets of ISGs may be needed to control and observe cells needed for an ATPG test pattern. This can further reduce the effective test data compression ratio (i.e., efficiency).

As was described above in Table 2, Test Application algorithms attempt to maximize the number of SRAS scan cells that are being loaded or unloaded simultaneously using the various compression modes in the SRAS DFT technology architecture described earlier to reduce TAT and TDV. However, it may be hampered by load conflicts in an LSG where two or more SRAS scan cells within the same LSG need to be loaded with opposite values (0 vs 1) for a given ATPG test pattern. The conflict arises from the fact that some SRAS scan cells cannot be loaded with 1's (0's) when other cells are being loaded with 0's (1's), respectively, by the SSB, for example, as shown in FIG. 24. This is because the SSI/SI pin holds only one value at any given time. Similarly, an unload conflict is defined when an unknown value (denoted by X) is present in one or more SRAS scan cells among a group of SRAS scan cells that are to be unloaded via a compression mechanism (using XOR-TREE) in the SAB through the TDO pin. Unknown values (X's) in an observe signal list will make XOR-TREE (or even OR-TREE) output become X, too. However, this embodiment of the SRAS DFT technique successfully mitigates such load (control) and unload (observe) conflicts of a group of SRAS scan cells in an LSG with the help of the following four distinct addressing modes of operation: (a) Less-Than-Or-Equal Address (LE) mode of operation to the current hierarchical segment (ISG or LSG) address value, i.e., simultaneously loading or unloading data to/from address locations which are less than or equal to the SAD address value in the current hierarchical segment (ISG or LSG); (b) Greater-Than Address (GT) mode of operation to the current hierarchical segment address value, i.e., simultaneously loading or unloading data to/from address locations which are greater than the address value in the current hierarchical segment; (c) All Except Address (AE) mode of operation addressed by the current hierarchical segment address value, i.e., simultaneously loading or unloading data to/from all address locations, except from the address in the current hierarchical segment; and (d) One Address (ON) mode of operation which is only the current hierarchical segment address value, i.e., loading or unloading data to/from the address locations in the current hierarchical segment.

The high level test compression algorithm corresponding to step 11.iii in Table 2 is shown in Table 5 below.

TABLE 5

Test Compression algorithm for a low level ISG

| | | |
|---|---|---|
| 1 | | Distribute/Allocate the control values in the current ATPG pattern into SRAS scan cells of Leaf Scan Groups (LSGs) |
| 2 | | Distribute/Allocate the observe values in the current ATPG pattern into SRAS scan cells of LSGs |
| 3 | | Distribute/Allocate the state values in the current ATPG pattern to SRAS scan cells of LSGs |
| 4 | | For each LSG with relevant control or observe values |
| 5 | A | Obtain control values from step 1 as vector C for the LSG |
| | B | Obtain observe values from step 2 as vector O for the LSG |
| | C | Obtain state (SRAS scan cell) values from step 3 as vector S for the LSG |
| | D | Calculate the load-unload sequence for LSG from O, C and S vectors |
| 6 | | Merge the load-unload sequence of each LSG into a load-unload sequence for all relevant ISGs |

Note that the load-unload sequence generation step 5.D in Table 5 above may involve multiple shift operations on SCB registers. The overall number of shift operations for the test pattern is the maximum value of the shift operation count for all relevant LSGs in the test pattern. In step 6, the last element (value) in the shift sequence is repeated for LSGs whose shift sequence is shorter than the maximum sequence. For example, if LSG 4 in FIG. 10 needs only one control shift operation, while LSGs 5, 6 and 7 require two control shift patterns for a particular ATPG tool test pattern, the control shift pattern for LSG 4 is repeated twice. The Test Compression algorithm for a low level ISG in the presence of conflicts (Step 5.d in Table 5 above) is shown in Table 6 below. Note that the algorithm in Table 6 gives priority to the unload operation over the load operation.

TABLE 6

Test Compression algorithm for low level
ISG in the Presence of Conflicts

1. While all required (with 0 or 1 value) bits in O vector have not been unloaded,
    a. Choose the addressing mode and address among LE, GT, AE and ON modes that can unload the maximum number of required bits from the O vector
    b. Choose between 0 and 1 as the stimulus to minimize the difference between the C and S vectors using the segment addressing mode and the address chosen previously
    c. Update O and S vector based on the chosen stimulus, segment address and addressing mode
2. While the current S vector does not fully satisfy the C vector
    a. Choose the stimulus value 0 or 1, segment addressing mode and segment address among LE, GT, AE and ON modes that minimizes the difference between the C vector and the S vector TABLE 6-continued Test Compression algorithm for low level
ISG in the Presence of Conflicts b. Update S vector based on the chosen stimulus, the SRAS scan cell address and the addressing mode The LSG load-unload sequence calculation step in Table 5 (step 5.D) in the presence of conflicts is described in more detail in Table 7 next. Steps 1.A to 1.E in Table 7 below correspond to step 1.a in Table 6 above. Steps 1.G to 1.J in Table 7 below correspond to step 1.b in Table 6 above. Steps 2.A to 2.G in Table 7 below correspond to step 2.a in Table 6 above. Step 1.0 in Table 7 below is a check for the usability of all-but-one mode with the current O vector. Step 2.E in Table 7 below is a check for the usability of all-but-one compression with the current C vector. During unload, as many SRAS scan cells as possible are also loaded. A cell state vector S is maintained to ensure that the final state of the SRAS scan cells in an LSG satisfies the ATPG test pattern requirements (values) in the control vector C. Note that a particular SRAS scan cell may be loaded multiple times with different values, but only the final value needs to be consistent with values in the ATPG specified control vector C. At each step, a locally optimum control mode, the corresponding address, and SI value are selected. During the unload priority step, at least one additional observe value is retired from the O vector. During the load priority step, at least one additional control value is satisfied by the S vector. Therefore, the algorithm always converges to a solution.

Table 7: Detailed Test Compression algorithm for low level ISG in the Presence of Conflicts 1. While current O vector is not all X values (i.e. expected cell values to be observed)
    A. Calculate the number (let it be OLEN) of bits in O vector that can be retired in LE addressing mode with the maximum address (=OLENA) of the SRAS cells related to bit values in O
    B. Calculate the number (let it be OGTN) of bits in O that can be retired in GT addressing mode with the lowest address (=OGTNA + 1) of the SRAS cells related to (0 or 1) bit values in O
    C. For each non-observe cell (in S vector) address i that has at least one observe cell address (in O vector) greater than i, and at least one observe SRAS scan cell address which is less than i in O vector
        i. Calculate the number of observe values (bits in O) that can be retired in AE addressing mode as OAONi, a running maximum as OAON and the corresponding address (to OAON) as OAONA; ties are broken randomly
    D. If the largest of OLEN, OGTN, OAON is greater than 1
        Set addressing mode to the mode of the largest of OLEN, OGTN, and OAON in current sequence element, while setting the address to the corresponding value from OLENA, OGTNA, or OAONA address values; ties for the largest are broken randomly
    E. Else
        Set addressing mode to ON and address to be the minimum address of the SRAS scan cells in O in current sequence element
    F. Remove corresponding bit entries (i.e. those carried out in steps D or E above) from the O vector
    G. Calculate the number (let it be I0) of control values in C that are satisfied by putting SI pin to 0
    H. Calculate the number (let it be I1) of control values in C that are satisfied by putting SI pin to 1
    I. If I0 >= I1, set SI pin to 0 in current sequence element
    J. If I1 > I0, set SI pin to 1 in current sequence element
    K. Update the current SRAS scan cell state S vector based on selected SI pin value, addressing mode, and address value

| | |
|---|---|
| 2 | While the current S vector does not fully satisfy the C vector |
| A | Calculate the number (let it be ILEN0) of control values that can be satisfied in LE addressing mode by setting SI pin to 0 with the maximum address ILEN0A of the unsatisfied SRAS cells related to bit values in C that need a 0 |
| B | Calculate the number (let it be ILEN1) of control values that can be satisfied in LE addressing mode by setting SI pin to 1 with the maximum address ILEN1A of the unsatisfied SRAS cells related to bit values in C that need a 1 |
| C | Calculate the number (let it be IGT0) of control values that can be satisfied in GT addressing mode by setting SI pin to 0 with the minimum address IGT0A of the unsatisfied SRAS cells related to bit values in C that need a 0 |
| D | Calculate the number (let it be IGT1) of control values that can be satisfied in GT addressing mode by setting SI pin to 1 with the minimum address IGT1A of the unsatisfied SRAS cells related to bit values in C that need a 1 |
| E | For each non-control address i that has an unsatisfied SRAS cell in the control vector C with that has at least one control cell address greater than i and at least one control cell address which is less than i |
| i | Calculate the number (let it be IAON0i) of control values that can be satisfied in AE addressing mode by setting SI pin to 0, a running maximum IAON0 and the corresponding (to IAON0) address IAON0A; ties for different addresses of same maximum are broken randomly |
| ii | Calculate the number (let it be IAON1i) of control values that can be satisfied in AE addressing mode by setting SI to 1, a running maximum IAON1 and the corresponding (to IAON1) address IAON1A; ties for different addresses of same maximum are broken randomly |
| F | If the largest of ILEN0, ILEN1, IGTN0, IGTN1, IAON0, or IAON1 is greater than 1 Set SI pin, and addressing mode to that of the largest of ILEN0, ILEN1, IGTN0, IGTN1, IAON0, or IAON1 values while setting the address to the corresponding address from ILEN0A, ILEN1A, IGTN0A, IGTN1A, IAON0A, or IAON1A values; any ties are broken randomly |
| G | Else Set addressing mode to ON and address to be the minimum address of the unsatisfied (i.e. those not loaded with ATPG assigned bit values) SRAS scan cells related to bit values in C, and SI to that bit value in C |
| H | Update the current SRAS scan cell state S vector based on selected SI value, addressing mode, and the SRAS scan cell address |

The algorithm in Table 7 above is illustrated on a 32 bit wide LSG for S, O, and C vectors where the vectors are given as S=01011010001111000001111xxxxxxxx; O=xxxxxxxx00111100xxxxxxxxxxxxxxxx; and C=00001100xxxxxxxxxxxxxxxxxxxxxxxx in Table 8 below. Note that X in the C vector denotes a don't-care value while X in S and O vectors denotes an unknown value. Note that the O vector is a subset of the S vector since S vector values can satisfy all O vector values. Bits in the vectors are referred with index from left to right as bit 31 down to bit 0.

TABLE 8

Execution Trace of the Test Compression algorithm

| | |
|---|---|
| 1 | Step 1.A: LE addressing mode is not feasible since bits 7 through 0 of the S vector are X |
| 2 | Step 1.B: GT addressing mode yields OGTN = 8 and OGTNA = 15; here 16 (= OGTNA + 1) is the (lowest) address of the bit which is not X in O vector |
| 3 | Step 1.C: AE addressing mode is again not feasible since bits 7 through 0 of S vector are X which conflicts with having known bits in S with an address less than 16 |
| 4 | Step 1: D = Greater-Than (GT) addressing mode with address 15 |
| 5 | Step 1.F: Updates the O vector to xxxxxxxxxxxxxxxxxxxxxxxxxxxxxxxx after retiring 00111100 bit values from O vector |
| 6 | Step 1.G: I0 = 6 (six 0's in C) |
| 7 | Step 1.H: I1 = 2 (two 1's in C) |
| 8 | Step 1.I: So, SI port bit is set to 0 |
| 9 | Step 1.K: S vector is updated to 0000000000000000000001111xxxxxxxx. i.e. bits at addresses higher than 15 in S vector get all 0 since it is GT mode with SI = 0 values for all |

TABLE 8-continued

Execution Trace of the Test Compression algorithm

| | |
|---|---|
| 10 | Step 2: The data consistency check between S vector and C vector fails because C needs 1's at addresses (27, 26) that S contains 0 values |
| 11 | Steps 2.A, 2.C and 2.E.i: No gain since the S vector needs only 0 bit values to 1 bit values (just 2 bits need to become 1's) transitions to become compatible with C |
| 12 | Step 2.B: No gain (ILEN1 is 0 when ILEN1A = 27) since the two useful 0 to 1 value transitions (bits 27 and 26) are offset by the two harmful 0 to 1 value transitions (bits 25 and 24) under LE addressing mode with address less than or equal to 27 |
| 13 | Step 2.D: A loss (IGT1 = −2, IGT1A = 25) since the two useful 0 to 1 value transitions (bits 27 and 26) are offset by four harmful 0 to 1 transitions (bits 31-28) in GT mode |
| 14 | Step 2.E.ii: Also causes a loss (IAON1 = −3, IAON1A = 24) since the two useful 0 to 1 transitions (bits 27 and 26) are offset by five harmful 0 to 1 transitions (bits 31, 30, 29, 28, 25) |
| 15 | Step 2.F: Fails since the best test compression strategy attempted leads to no gain |
| 16 | Step 2.G: ON addressing mode with address 26 is chosen |
| 17 | Step 2.H: The S vector is updated to 00000100000000000000001111xxxxxxxx |
| 18 | Step 2: Repeat once more since data consistency check between S and C still fails |
| 19 | Step 2.G: ON addressing mode selected again with address 27 similar to step 16 above |
| 20 | Step 2.H: Finally S vector is updated to 00001100000000000000001111xxxxxxxx |

TABLE 8-continued

Execution Trace of the Test Compression algorithm

21  Step 2: The S vector is now compatible
    with C vector, and hence the check in step 2
    of Table 7 fails and the algorithm
    terminates having achieved the goals
22  The final SRAS sequence is
    (mode = GT, SI = 0, AD = 15, SO = 0), (mode = ON, SI = 1,
    AD = 26, SO = 1), and (mode = ON, SI = 1, AD = 27, SO = 1)

Alternative Embodiments:

As described above, the Control Override (CO), Observe Override (OO), Observe Enable (OE) and Output Select (OS) ports of an SRAS scan cell are used only for special cases and are optional for the general case. Therefore, 15 alternative embodiments can be postulated based on the presence or absence of these signals in an embodiment of an SRAS DFT technique. An embodiment without the OO, CO, OE and OS ports will have a minimum DCCT area since a certain amount of logic circuitry is not included.

TAT for serial scan DFT techniques is reduced by using multiple parallel scan chains at the top level of the DCCT. Each top level scan input or output port is also referred to as a scan channel. This methodology can be extended to the SRAS DFT technique by removing TSG in FIG. 10. This increases the number of scan channels from 1 to the SRAS segment_size. Therefore, each such scan channel has its own dedicated CSI and CSO ports from FIG. 26, whereas, all other control signals (i.e. ASE, AIN, OE, CO, OO, OS, and RST) can be shared among all the scan channels. The number of scan channels in this arrangement is the segment_size since the CSI and CSO of each ISG immediately below the TSG (ISG[1,0]) is brought out to chip pins.

In the CRAS-N or SRAS DFT technique describe here, as shown in FIG. 26, only one scan input port and one scan output port are connected to the next level of hierarchy. The area overhead of the SRAS DFT technique can be further reduced by using word parallel versions of the SSB, the SAB and the SCB. If M is the width of the word, then M*segment_size SRAS cells are connected to an LSG, where symbol * implies multiplication. This increases the signal width of the CSI and CSO ports of an LSG. For example, byte-wide versions of SSB, SAB and SCB can be constructed to reduce the area overhead of the SRAS DFT technique logic by a factor of 8. TAT is also reduced by a factor of 8 since the number of top level scan channels also increases to 8.

Another alternative embodiment is to remove the CG bit from the SCB in FIG. 21. This increases the data compression ratio since shift lengths are reduced. The CG bit was introduced in FIG. 21 to reduce power dissipated during capture operation. This alternative may be used in designs where power dissipation during data capture is not of concern.

An SCB that implements a post-mux such that the lower level SCB registers are included after the SCB registers at the current level is an alternative embodiment.

Another alternate embodiment is to make a DCCT configured for testing in accordance with the SRAS DFT technique not share the test mode and global control signals between (at the top level) scan channels as shown in FIG. 26. For example, each of the ISGs under the TSG can have separate test mode and global control signals. This can improve the frequency of the SRAS system by reducing long paths from chip pins.

If the total number of scan channels (W) is determined prior to configuring a DCCT in accordance with the SRAS DFT technique, an implementation may have W TSGs. For example, if a chip can be partitioned into W sub-chips with minimal interaction between them, then each sub-chip can get its own independent TSG to reduce design time.

Using one or more subsets of the three (3) modes of operation GT, LE and AE is also an alternate embodiment.

Note that additional scan input and output pipelining can be added between the chip scan inputs/chip scan outputs to the TSG in FIG. 26 for improved shift performance.

A special nomenclature nB mS tC pX qP is used to denote alternate embodiments of the SRAS DFT technique. Here n refers to the fixed SRAS segment_size at all the levels, m refers to the number of segments or dimension_count at the TSG level, t refers to the number of scan channels, p corresponds to presence of compression modes, and q denotes the presence of pipelining. All the variants of SRAS DFT technique implied by this nomenclature are alternate embodiments.

The inventors have discovered that, advantageously, one or more embodiments of a DCCT configured for testing in accordance with the SRAS DFT, unlike other RAS DFT techniques, is not dependent on the physical layout of the DCCT. Further, the inventors have discovered that circuitry provided in accordance with the SRAS DFT technique can be implemented as standard semiconductor technology cells, which cells are the basic building blocks that circuit manufacturers provide to circuit designers to create DCCTs, and do not require special analog components like sense amplifiers. As a result, the inventors have discovered that implementing an embodiment of a DCCT configured for testing in accordance with the SRAS DFT technique neither disrupts nor alters current DCCT design and implementation flows.

The inventors have discovered that one or more embodiments of a DCCT configured for testing in accordance with the SRAS DFT technique provides a multi-dimensional addressing technique without upper limits on the number of dimensions in the logical structure of the DCCT. Further, the SRAS DFT technique also facilitates multiples of hierarchical levels with lower hierarchical structures being reused to build up higher levels in the hierarchy in a reusable architecture scheme. As a result, as the inventors have discovered, this reduces wire routing congestion, TAT, and TDV over the prior art which is limited to a monolithic 2-dimensional grid that can at best be made into stack-like configurations only.

Embodiments described above are exemplary. For example, numerous specific details are set forth to provide a thorough understanding of the present invention. However, as one having ordinary skill in the art would recognize, the present invention can be practiced without resorting to the details specifically set forth. As such, many changes and modifications may be made to the description set forth above by those of ordinary skill in the art (i.e., various refinements and substitutions of the various embodiments are possible based on the principles and teachings herein) while remaining within the scope of the invention. Methods and mechanisms suitable for fabricating various embodiments or portions of various embodiments described above have not been repeated, for sake of brevity, wherever it should be well understood by those of ordinary skill in the art that the various embodiments or portions of the various embodiments could be constructed utilizing the same or similar previously described methods or mechanisms. As such, the scope of the invention should be determined with reference to the appended claims along with their full scope of equivalents.

What is claimed is:

1. A digital electronic circuit (DCCT) configured for testing in accordance with a hierarchical, compressed, random access scan (CRAS-N) Design-for-Test (DFT) technique comprises:
   the DCCT wherein a plurality of data storage cells in the DCCT comprise data storage cells having a random access back-door mechanism (random access scan cells); and
   a tree structure hierarchy of demultiplexor/decompressor logic circuitry and multiplexor/compressor logic circuitry (DDMC circuit block) wherein the hierarchy comprises N levels, wherein N is an integer number, and wherein a higher level DDMC circuit block in the hierarchy is interfaced to lower level DDMC circuit blocks in the hierarchy.

2. The DCCT of claim 1 wherein the number of DDMC circuit blocks is not the same at one or more levels in the hierarchy.

3. The DCCT of claim 1 wherein:
   a top level demultiplexor/decompress or logic circuitry and multiplexor/compressor logic circuitry (DDMC circuit block) wherein:
   the DCCT is partitioned into successive sub-circuits N−1 times and each such successive DCCT sub-circuit is associated with a DDMC circuit block;
   the DDMC circuit blocks are arranged in a hierarchy of N levels of DDMC circuit blocks; and
   a DDMC circuit block at hierarchy level 1 interfaces to random access scan cells and to a DDMC circuit block at level 2; and
   the DDMC circuit block at hierarchy level 2 interfaces to DDMC circuit blocks at hierarchy level 1 and to a DDMC circuit block at level 3; and so on until a top level DDMC circuit block in the hierarchy of DDMC circuit blocks interfaces highest circuit level scan pins to immediately lower level DDMC circuit blocks in the hierarchy of DDMC circuit blocks.

4. A digital electronic circuit (DCCT) configured for testing in accordance with a segmented, random access scan (SRAS) Design-for-Test (DFT) technique comprises:
   the DCCT wherein a plurality of data storage cells in the DCCT comprise data storage cells having a random access back-door mechanism (SRAS scan cells); and
   a tree structure hierarchy of test access blocks, which hierarchy of test access blocks includes, at the top of the hierarchy, a top test access block (top scan group (TSG)) that interfaces highest circuit level scan pins to the SRAS scan cells, and, at the lowest level hierarchical test access block (a leaf scan group (LSG)), includes SRAS scan cells;
   wherein:
   test access blocks at the second level of the hierarchy (intermediate scan groups (ISGs)) interface to the LSGs and to a test access block at a higher level in the hierarchy (higher level ISG) or to the TSG; and
   higher level ISGs interface to ISGs and to an ISG at a still higher level in the hierarchy or to the TSG.

5. The DCCT of claim 4 wherein:
   a number of test access blocks at each level of the hierarchy below the TSG is a predetermined number;
   each LSG includes the predetermined number of SRAS scan cells;
   ISGs at the second level of the hierarchy interface to the predetermined number of LSGs and to an ISG at a higher level in the hierarchy or to the TSG; and
   ISGs above the second level of the hierarchy interface to the predetermined number of ISGs at a lower level in the hierarchy and to an ISG at a higher level in the hierarchy or to the TSG.

6. The DCCT of claim 5 wherein a test access block at a level in the hierarchy decodes a scan address and generates a select signal for scan groups at a lower level; and
   at the lowest level, an LSG decodes a scan address signal and generates a select signal for scan cells.

* * * * *